(12) United States Patent
Chiang et al.

(10) Patent No.: US 11,716,862 B2
(45) Date of Patent: Aug. 1, 2023

(54) NON-VOLATILE MEMORY WITH DUAL GATED CONTROL

(71) Applicant: Taiwan Semiconductor Manufacturing Co., Ltd., Hsin-Chu (TW)

(72) Inventors: Katherine H Chiang, New Taipei (TW); Chung-Te Lin, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/116,024

(22) Filed: Dec. 9, 2020

(65) Prior Publication Data
US 2021/0375867 A1    Dec. 2, 2021

Related U.S. Application Data

(60) Provisional application No. 63/031,035, filed on May 28, 2020.

(51) Int. Cl.
*H01L 27/12* (2006.01)
*H10B 99/00* (2023.01)
*H01L 29/786* (2006.01)

(52) U.S. Cl.
CPC .......... *H10B 99/00* (2023.02); *H01L 27/124* (2013.01); *H01L 27/1225* (2013.01); *H01L 27/1255* (2013.01); *H01L 27/1259* (2013.01); *H01L 29/7869* (2013.01)

(58) Field of Classification Search
CPC ............ H01L 27/1052; H01L 27/1225; H01L 27/124; H01L 27/1255; H01L 27/1259; H01L 29/7869

USPC .......................................................... 257/43
See application file for complete search history.

(56) References Cited

U.S. PATENT DOCUMENTS

| | | | | |
|---|---|---|---|---|
| 5,712,817 A | * | 1/1998 | Suh | G11C 11/403 |
| | | | | 257/E27.084 |
| 8,507,907 B2 | | 8/2013 | Takahashi et al. | |
| 8,902,637 B2 | * | 12/2014 | Takemura | G11C 11/24 |
| | | | | 365/149 |
| 2001/0028078 A1 | * | 10/2001 | Noble | H01L 27/108 |
| | | | | 257/E21.652 |
| 2002/0027796 A1 | * | 3/2002 | Kato | G11C 11/22 |
| | | | | 365/145 |
| 2002/0041512 A1 | * | 4/2002 | Kato | G11C 11/22 |
| | | | | 365/145 |
| 2002/0172070 A1 | | 11/2002 | Arimoto et al. | |
| 2009/0009186 A1 | * | 1/2009 | Kaneko | G01R 31/74 |
| | | | | 324/705 |

(Continued)

*Primary Examiner* — Ori Nadav
(74) *Attorney, Agent, or Firm* — Eschweiler & Potashnik, LLC

(57) ABSTRACT

A memory device includes a plurality of memory cells. A first memory cell of the plurality of memory cells includes a first write transistor includes a first write gate, a first write source, and a first write drain. A first read transistor includes first read gate, a first read source, a first read drain, and a first body region separating the first read source from the first read drain. The first read source is coupled to the first write source. A first capacitor has a first upper capacitor plate coupled to the first write drain and a first lower capacitor plate coupled to the first body region of the first read transistor.

20 Claims, 16 Drawing Sheets

(56) References Cited

U.S. PATENT DOCUMENTS

| | | | |
|---|---|---|---|
| 2010/0046298 A1* | 2/2010 | Tsumura | G11C 16/10 |
| | | | 365/185.18 |
| 2011/0186837 A1 | 8/2011 | Takahashi et al. | |
| 2011/0260158 A1* | 10/2011 | Takemura | H01L 27/0207 |
| | | | 257/E27.081 |
| 2016/0099258 A1 | 4/2016 | Yoneda | |
| 2019/0295941 A1 | 9/2019 | Ramaswamy | |
| 2019/0371802 A1* | 12/2019 | Morris | H01L 28/60 |
| 2020/0144265 A1 | 5/2020 | Bao et al. | |

* cited by examiner

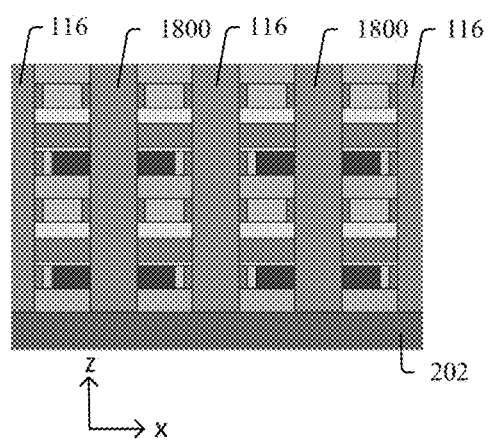
Fig. 18
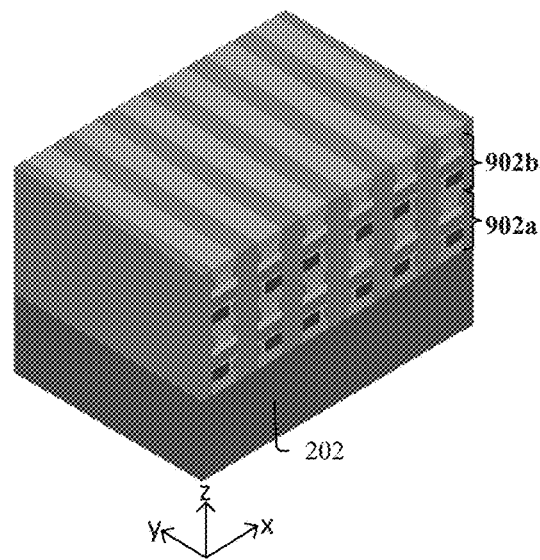
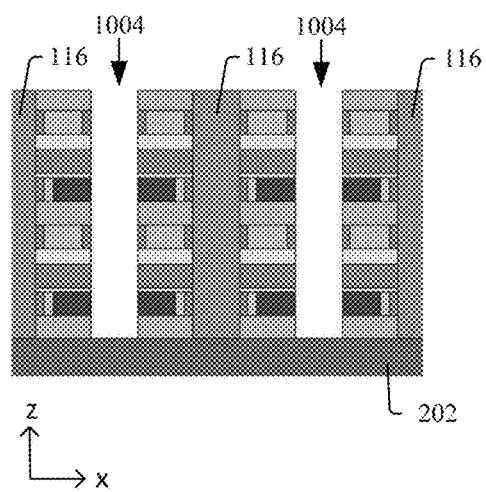
Fig. 19
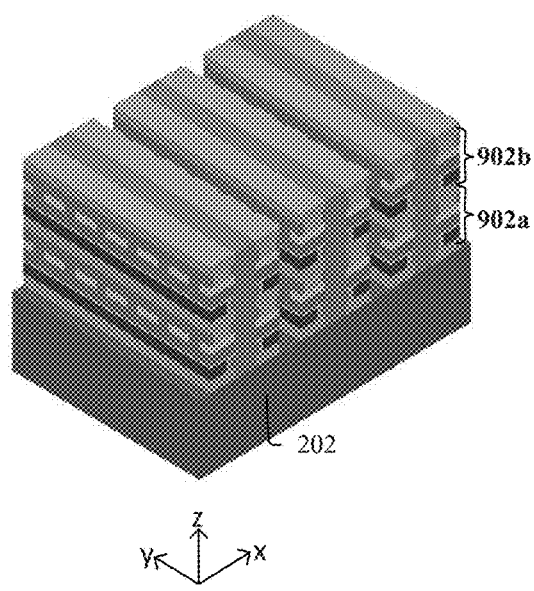

NON-VOLATILE MEMORY WITH DUAL GATED CONTROL

REFERENCE TO RELATED APPLICATION

This application claims the benefit of U.S. Provisional Application No. 63/031,035, filed on May 28, 2020, the contents of which are hereby incorporated by reference in their entirety.

BACKGROUND

Semiconductor memory is an electronic data storage device, often used as computer memory and implemented on a semiconductor-based integrated circuit. Semiconductor memory is made in many different types and technologies. Semiconductor memory has much faster access times than other types of data storage technologies. For example, a byte of data can often be written to or read from semiconductor memory within a few nanoseconds, while access times for rotating storage such as hard disks is in the range of milliseconds. For these reasons, among others, semiconductor memory is used as a primary storage mechanism for computer memory to hold data the computer is currently working on, among other uses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9-29 depict a series of cross-sectional and perspective views that collectively depict a manufacturing flow for making a memory device.

DETAILED DESCRIPTION

Figure 1:
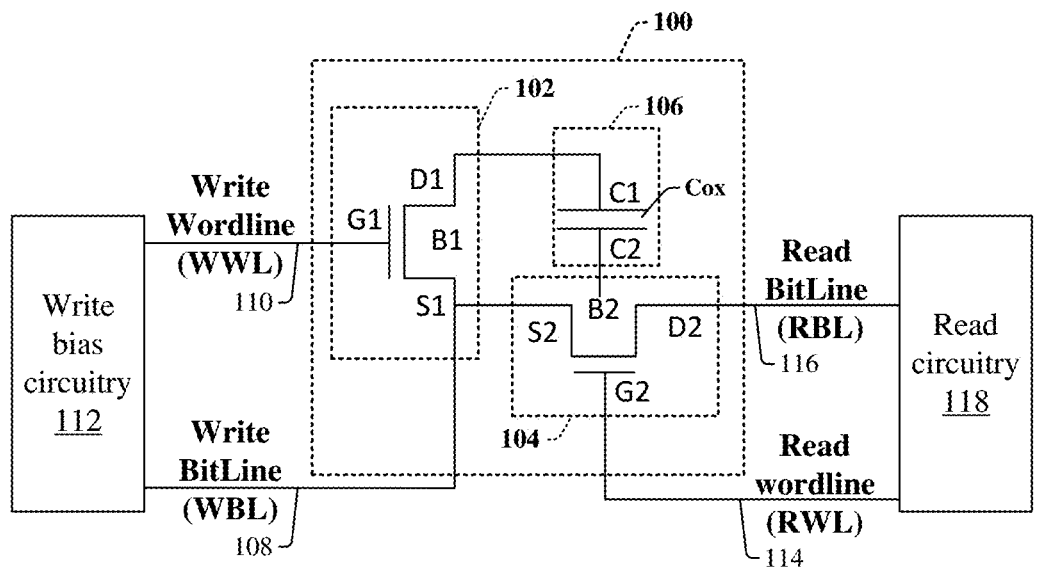
FIG. 1 depicts a schematic representation of some embodiments of a two-transistor memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example schematic of a memory cell 100 in accordance with some embodiments. The memory cell 100 includes two transistors—namely a write transistor 102 and a read transistor 104—and a capacitor 106, which are operably coupled as shown. More particularly, the write transistor 102 includes a write gate (G1), a write source (S1), a write drain (D1), and a write body region (B1) that separates the write source (S1) from the write drain (D1). The read transistor 104 includes a read gate (G2), a read source (S2), a read drain (D2), and a read body region (B2) that separates the read source (S2) from the read drain (D2). The read source (S2) is coupled to the write source (S1), both of which are coupled to a write bitline (WBL) 108. The capacitor 106 has an upper capacitor plate (C1) coupled to the write drain (D1) and a lower capacitor plate (C2) coupled to the body region (B2) of the read transistor 104. A capacitor dielectric (Cox) separates the upper capacitor plate (C1) from the lower capacitor plate (C2). It will be appreciated that the naming convention of "source" and "drain" as used herein is somewhat arbitrary, and these terms can be interchanged in other embodiments and/or can be alternatively referred to as source/drain regions.

A write wordline (WWL) 110 is coupled to the write gate (G1). Write bias circuitry 112 is coupled to the write bitline WBL 108 and write wordline WWL 110. The write bias circuitry 112 is configured to write/store various predetermined amounts of charge on the capacitor 106, wherein the predetermined amounts of stored charge set a voltage threshold of the read transistor 104 to correspond to one of at least two predetermined data states. A read wordline (RWL) 114 is coupled to the read gate (G2), and a read bitline (RBL) 116 is coupled to the read drain (D2). Read circuitry 118 is coupled to the RWL 114 and RBL 116. The read circuitry 118 is configured to determine a data state stored in the memory cell 100 by determining whether the voltage threshold set by the amount of charge stored on the capacitor 106 is greater than or less than a predetermined voltage threshold.

In some embodiments (see Table 1 below), the memory cell 100, write bias circuitry 112, and read circuitry 118 can be configured such that a single bit of data that is either in a "0" data state or a "1" data state is stored in the memory cell 100. In other embodiments (see Table 2 below), the memory cell 100, write bias circuitry 112, and read circuitry 118 can be configured such that multiple bits of data (e.g., two bits or more of data) is stored in the memory cell 100.

Table 1 illustrates some embodiments of how the write bias circuit 112 and read circuit 118 can bias the WBL 108, WWL 110, RWL 114, and RBL 116 to write a single bit (e.g., either a "0" state or a "1 state) to the memory cell 100 and to read the various data states from the memory cell 100.

TABLE 1 example bias conditions for single-bit reads/writes

|  | WWL | WBL | RWL | RBL |
|---|---|---|---|---|
| single bit "0" | Vdd | Gnd | Gnd | Gnd/Float |
| single bit "1" | Vdd | Vwrite | Gnd | Gnd/Float |
| Read | Gnd | Gnd | Vread | Vdd |

As noted above, generally the amount of charge stored on the capacitor 106 can be set to one of various predetermined charge levels that set the threshold voltage of the read transistor 104 to one of various predetermined threshold voltages, whereby the various predetermined threshold voltages correspond to different data states. For example, in some embodiments, the memory cell 100 can store a single bit that is either a "0" or a "1". Thus, in Table 1, to write a single-bit "0", the WWL 110 is driven to Vdd to enable the write transistor 102, and while the WWL 110 is held at Vdd, the WBL 108 is taken to Ground, which strips charge off the capacitor 106 and correspondingly decreases the body bias applied to the body (B2) of the read transistor 104. The WWL 110 is then de-asserted (e.g., taken to ground), such that the low-charge condition remains on the capacitor 106 in a non-volatile fashion. In contrast, to write a single-bit "1" to the memory cell 100, the WWL 110 is driven to Vdd to enable the write transistor 102, and the WBL 108 is concurrently held at Vwrite (e.g., Vdd or other appropriate voltage) which adds charge onto the capacitor 106 and correspondingly increases the body bias applied to the body (B2) of the read transistor 104. The WWL 110 is then de-asserted (e.g., taken to ground), such that this high-charge condition remains on the capacitor 106 in a non-volatile fashion. Because the voltage threshold of the read transistor 104 changes based on its body bias (and hence, charge stored on the capacitor 106), the read transistor 104 exhibits different threshold voltages for the "0" data state and the "1" data state. Thus, for a read operation, the WWL 110 and WBL 108 are grounded, the RWL 114 is driven to a Vread voltage (e.g., a high voltage) to selectively enable the read transistor 104, and the RBL 116 is driven to VDD. Under this bias condition, the source/drain voltage over the read transistor 104 (and/or amount of current flowing through the read transistor 104) is based on how the Vread voltage relates to the voltage threshold of the read transistor (and hence also relates to the body bias applied to the read transistor 104 and the amount of charge stored in the capacitor 106). Thus, if a small amount of charge is stored in the capacitor 106 (e.g., logical "0" and small body bias), the voltage threshold of the read transistor 104 is greater than Vread, and little or no current will flow over the read transistor 104 during the read operation. In contrast, if a large amount of charge is stored on the capacitor 106 (e.g., logical "1" and large body bias), the voltage threshold of the read transistor 104 is less than Vread, and more current will flow over the read transistor 104 during the read operation. The read circuitry 118 can measure the voltage bias between the read source S2 and read drain D2 (and/or can measure the current between the read source S2 and read drain D2) to determine whether a "0" data state or a "1" data state was stored in the memory cell 100.

Table 1 illustrates an example of how the write bias circuit 112 and read circuitry 118 in other embodiments can bias the WBL 108, WWL 110, RWL 114, and RBL 116 to write a multi-bit state to the memory cell 100 and to read the various data states from the memory cell 100.

TABLE 2 example bias conditions for multi-bit reads/writes

|  | WWL | WBL | RWL | RBL |
|---|---|---|---|---|
| Write dual bit "00" | Vdd | Gnd | Gnd | Gnd/Float |
| Write dual bit "11" | Vdd | Vwrite | Gnd | Gnd/Float |
| Write dual bit "01" | Vdd | Vwrite × k1 | Gnd | Gnd/Float |
| Write dual bit "10" | Vdd | Vwrite × k2 | Gnd | Gnd/Float |
| Read | Gnd | Gnd | Vread | Vdd |

Table 2 shows another example of bias conditions that can be applied to store multiple bits in the memory cell at a given time. In this example, the memory cell stores two bits at a given time that represent four data states, but it will is appreciated in general any number of bits can be stored. In this example, k1 can be ⅓ for example and k2 can be ⅔ for example, but other values are also possible to provide adequate spacing between the various write data states.

Figure 2:
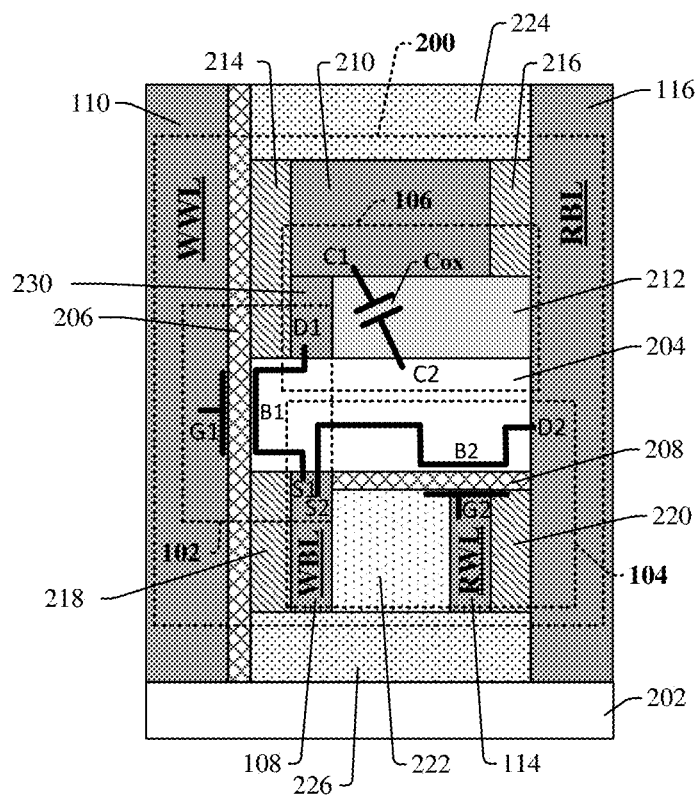
FIG. 2 depicts a cross-sectional view of some embodiments of a memory cell that is disposed over a semiconductor substrate and is consistent with FIG. 1's schematic representation.

Turning now to FIG. 2, one can see a cross-sectional view of a memory cell 200 that is disposed over a semiconductor substrate 202. The memory cell 200 of FIG. 2 is consistent with FIG. 1's schematic, and thus includes a write transistor 102, read transistor 104, and capacitor 106 that are operably coupled as described in FIG. 1. It will be appreciated that the schematic of FIG. 1 may manifest in various forms, and the implementation of FIG. 2 offers various advantages from performance and manufacturing perspectives but is a non-limiting example of how FIG. 1's schematic can be implemented.

As shown in FIG. 2, these components of the memory cell 200 are disposed on a semiconductor substrate 202. The semiconductor substrate 202 can manifest as a monocrystalline silicon substrate, a semiconductor on insulator (SOI) substrate, or another substrate; and can include multiple substrates and/or interconnect structures stacked over one another.

As shown, the memory cell 200 includes a body region 204, which comprises a semiconductor material such as Indium gallium zinc oxide (IGZO), Indium tin oxide (ITO), Indium tungsten zinc oxide (IWZO), and/or channel materials with low off-current across temperature disposed over an upper surface of the semiconductor substrate 202. The body region 204 can correspond to the body (B1) of the write transistor 102, the body (B2) of the read transistor 104, and the lower capacitor plate (C2) of the capacitor 106.

A write wordline WWL 110 extends along a first side of the body region 204, though WWL 110 is separated from the first side of the body region 204 by a write wordline gate dielectric 206. A read bitline (RBL) 116 extends along a second side of the body region 204 opposite the first side and is coupled to the body region 204. A write bitline (WBL) 108 is disposed between the upper surface of the semiconductor substrate 202 and a lower surface of the body region 204, and is disposed between the WWL 110 and the RBL 116. A read wordline (RWL) 114 is also disposed between the upper surface of the semiconductor substrate 202 and the lower surface of the body region 204, and is disposed between the WBL 108 and the RBL 116. The RWL 114 is separated from the lower surface of the body region 204 by a read wordline gate dielectric 208.

In some embodiments, the write wordline gate dielectric 206 and the read wordline gate dielectric 208 may comprise a dielectric material, such as silicon dioxide or a high-k dielectric, such as hafnium oxide (HfO2). In some embodiments, the WWL 110, RBL 116, WBL 108, and RWL 114 comprise a metal, such as tungsten (W), copper (Cu), aluminum (Al), Titanium nitride (TiN), or tantalum nitride (TaN), or a CMOS contact metal, among others; doped polysilicon; or another conductive material.

The capacitor 106 is disposed over an upper surface of the body region 204 and is disposed between the WWL 110 and the RBL 116. The capacitor 106 is configured to selectively store varying levels of charge corresponding to varying data states on the body region 204. In particular, the capacitor 106 can include an upper capacitor plate (C1) 210 which is coupled to the drain (D1) 230 of the write transistor 102, a lower capacitor plate (C2) corresponding to the body region 204, and a capacitor dielectric 212 disposed between the upper capacitor plate (C1) and lower capacitor plate (C2). The upper capacitor plate 210 and the drain (D1) 230 of the write transistor 102 can comprise doped semiconductor material (e.g., p-doped or n-doped silicon), or a metal, such as tungsten (W), copper (Cu), aluminum (Al), Titanium nitride (TiN), tantalum nitride (TaN), or a CMOS contact metal, among others. The capacitor dielectric 212 can comprise silicon dioxide or a high-k dielectric, and in some embodiments can comprise aluminum oxide (Al2O3), Hafnium oxide (HfO2), tantalum oxide (Ta2O5), Zirconium oxide (ZrO2), Titanium oxide (TiO2), strontium titanium oxide (SrTiO3), or another high-k dielectric material, among others.

Dielectric regions (214, 216, 218, 220, and 222), such as silicon dioxide or a low-k dielectric, can provide electrical isolation between the conductive features within the memory cell 200. Further dielectric regions 224 and 226 can provide electrical isolation between the memory cell 200 and the substrate 202, and/or between the memory cell 200 and additional memory cells stacked above or below the memory cell 200. In some embodiments, the further dielectric regions 224 and 226 can be a nitride, such as silicon nitride or silicon oxynitride, but in other embodiments can be another dielectric material such as silicon dioxide, silicon carbide oxide, or others.

In some embodiments, the write wordline WWL 110 extends vertically and continuously from an upper surface of the capacitor (e.g., top surface of 210) to a bottom surface of the write bitline WBL 108 or to a bottom surface of the read wordline RWL 114. In some embodiments, the read bitline RBL 116 also extends vertically and continuously from an upper surface of the first capacitive element (e.g., top of 210) to a bottom surface of the write bitline WBL 108 or to a bottom surface of the read wordline RWL 114.

Although FIG. 2 illustrates only a single memory cell 200, it will be appreciated that any number of such memory cells can be "stacked" over the illustrated memory cell, to the left or the right of the illustrated memory cell, or even between the illustrated memory cell and the substrate 202. Some non-limiting examples of how such memory cells can be arranged are now illustrated and described in FIGS. 3-8.

Figure 3:
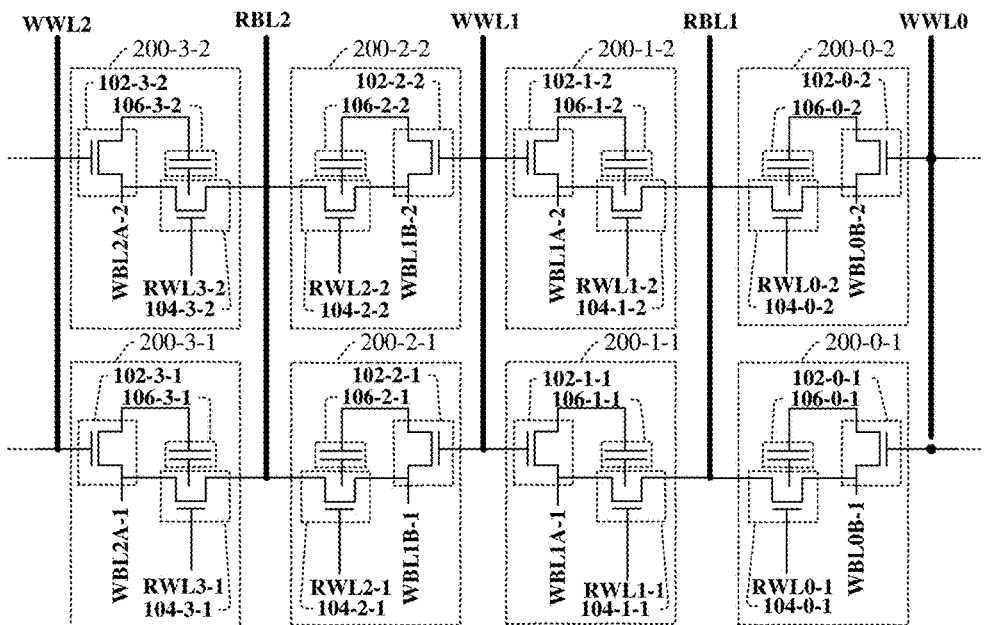
FIG. 3 depicts a schematic representation of some embodiments of an array including eight two-transistor memory cells.
Figure 4:
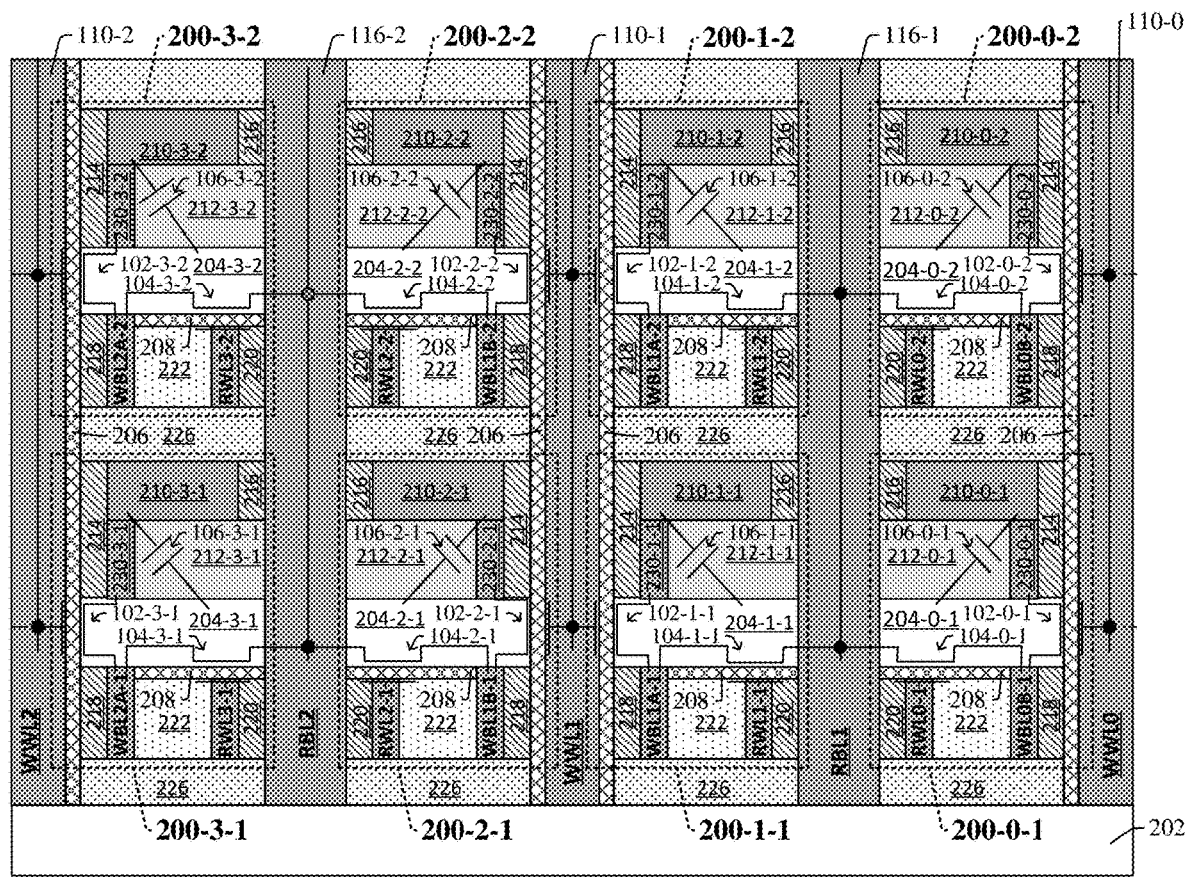
FIG. 4 depicts a cross-sectional view of some embodiments of eight two-transistor memory cells disposed over a semiconductor substrate consistent with FIG. 3's schematic representation.

FIG. 3 depicts a schematic drawing including eight memory cells that are included in a portion of a memory array, and FIG. 4 depicts a cross-sectional view of eight memory cells consistent with FIG. 3's schematic. FIG. 3-4 are now described concurrently in the context of a first memory cell (e.g., 200-1-1), second memory cell (e.g., 200-1-2), third memory cell (e.g., 200-0-1), and fourth memory cell (e.g., 200-2-1); but it will be appreciated that in general "first", "second", "third, "fourth" and the like are merely generic identifiers and these identifiers can in general be used to describe any of memory cells of FIG. 3 and/or the various identifiers can be transposed or interchanged in other embodiments. Each of the memory cells in FIG. 3 can correspond to the schematic and functionality described with regards to FIG. 1, and can correspond to the cross-section described with regards to FIG. 2.

In FIGS. 3-4, a first memory cell 200-1-1 comprises a first write transistor 102-1-1 comprising a first write gate WWL1 110-1, a first write source WBL1A-1, and a first write drain 230-1-1; and a first read transistor 104-1-1 comprising a first read gate RWL1-1, a first read source WBL1A-1, a first read drain RBL1 (116-1), and a first body region 204-1-1 separating the first read source from the first read drain. The first read source WBL1A-1 is the same node as the first write source WBL1A-1. A first capacitor 106-1-1 has a first upper capacitor plate 210-1-1 coupled to the first write drain 230-1-1 and a first lower capacitor plate 204-1-1 corresponding to the first body of the first read transistor 104-1-1.

A second memory cell 200-1-2 is disposed over the first memory cell 200-1-1. The first write wordline WWL1 extends alongside the first memory cell 200-1-1 and the second memory cell 200-1-2. The second memory cell 200-1-2 comprises: a second write transistor 102-1-2 comprising a second write gate corresponding to WWL1 110-1, a second write source WBL1A-2, and a second write drain 230-1-2; and a second read transistor 104-1-2 comprising a second read gate RWL1-2, a second read source WBL1A-2, a second read drain RBL1, and a second body region 204-1-2 separating the second read source from the second read drain. The second read source WBL1A-2 is the same node as the second write source WBL1A-2. A second capacitor 106-1-2 has a second upper capacitor plate 210-1-2 coupled to the second write drain 230-1-2 and a second lower capacitor plate corresponding to the second body 204-1-2 of the second read transistor. A second write bitline WBL1A-2 is disposed between the upper surface of the first capacitive element and a lower surface of the second body region 204-1-2, and is disposed between the first write wordline WWL1 and the first read bitline RBL1. A second read wordline RWL1-2 is disposed between the upper surface of the first capacitive element and the lower surface of the second body region 204-1-2, and is disposed between the first write wordline WWL1 and the first read bitline RBL1. The second read wordline RWL1-2 is separated from the lower surface of the second body region 204-1-2 by a second read wordline gate dielectric 208. A second capacitor 106-1-2 is disposed over an upper surface of the second body region 204-1-2 and is disposed between the first write wordline WWL1 and the first read bitline RBL1. The second capacitor is configured to selectively store varying levels of charge corresponding to varying data states on the second body region 204-1-2.

A third memory cell 200-0-1 is disposed alongside the first memory cell 200-1-1 (e.g., to the right of the first memory cell 200-1-1 in FIGS. 3-4). The third memory cell 200-0-1 includes a third write transistor 102-0-1 comprising a third write gate WWL0, a third write source 230-0-1, and a third write drain WBL0B-1; and a third read transistor 104-0-1 comprising third read gate RWL0-1, a third read source WBL0B-1, a third read drain RBL1, and a third body region 204-0-1 separating the third read source WBL1A-1 from the third read drain RBL1. The third read source WBL0B-1 is the same node as the third write source. A third capacitor 106-0-1 has a third upper capacitor plate 210-0-1 coupled to the third write drain 230-0-1 and a third lower capacitor plate corresponds to the third body 204-0-1 of the third read transistor. The first read bitline RBL1 extends between the first memory cell 200-1-1 and the third memory cell 200-0-1. The first read bitline RBL1 is coupled to the first body region 204-1-1 and the third body region 204-0-1. The first memory cell 200-1-1 and third memory cell 200-0-1 are mirror images of one another about the first read bitline RBL1.

A fourth memory cell 200-2-1 is disposed alongside the first memory cell 200-1-1 (e.g., to the left of the first memory cell 200-1-1 in FIGS. 3-4). The fourth memory cell 200-2-1 comprises a fourth body region 204-2-1 disposed over the upper surface of the semiconductor substrate 202 and to a side of the first write wordline WWL1 opposite the first body region 204-1-1; a second read bitline RBL2 extending along a side of the fourth body region 204-2-1 furthest from the first body region 204-1-1 and coupled to the fourth body region 204-2-1. A fourth write bitline WBL1B-1 is disposed between the upper surface of the semiconductor substrate 202 and a lower surface of the fourth body region 204-2-1, and is disposed between the first write wordline WWL1 and the second read bitline RBL2. A fourth read wordline RWL2-1 is disposed between the upper surface of the semiconductor substrate 202 and the lower surface of the fourth body region 204-2-1, and is disposed between the first write wordline WWL1 and the second read bitline RBL2. The fourth read wordline RWL2-1 is separated from the lower surface of the fourth body region 204-2-1 by a fourth read wordline gate dielectric 208. A fourth capacitor 106-2-1 is disposed over an upper surface of the fourth body region and is disposed between the first write wordline WWL1 and the second read bitline RBL2. The fourth capacitor 106-2-1 is configured to selectively store varying levels of charge corresponding to varying data states on the fourth body region 204-2-1, and includes a fourth upper capacitor electrode 210-2-1 and a fourth lower capacitor electrode corresponding to the fourth body region 204-2-1.

Figure 5:
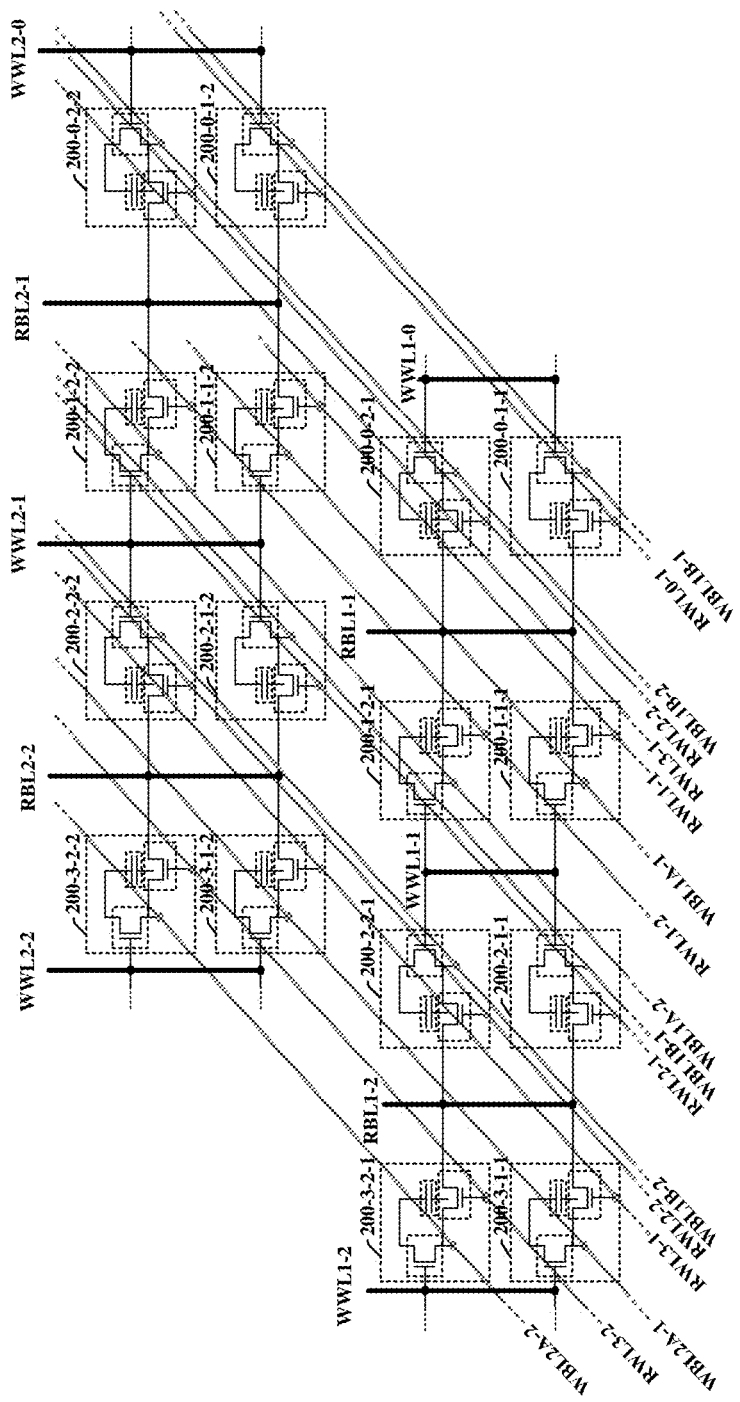
FIG. 5 depicts a schematic representation of some embodiments of an array including sixteen two-transistor memory cells.
Figure 6:
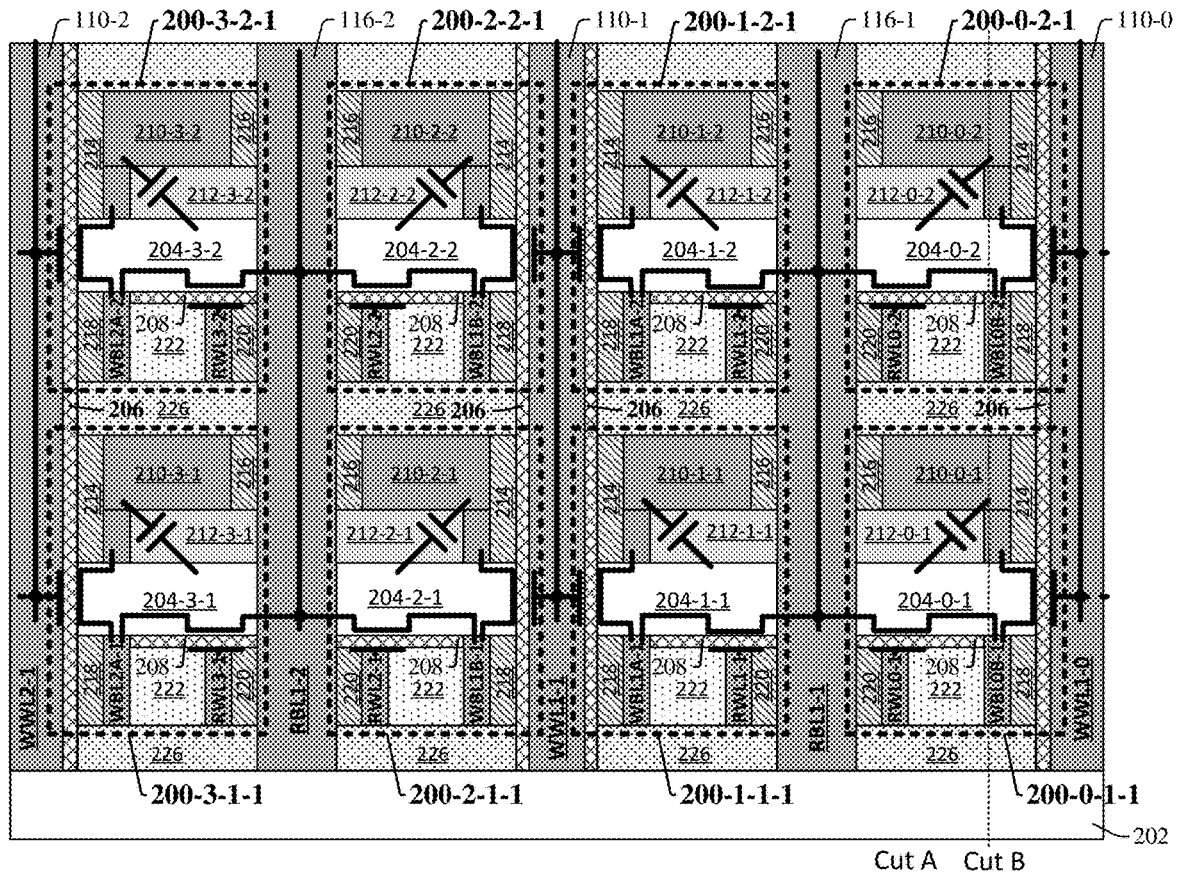
FIGS. 6-8 depict a cross-sectional view and various perspective cut-away views of some embodiments of an array of two-transistor memory cells consistent with FIG. 5's schematic representation.
Figure 7:
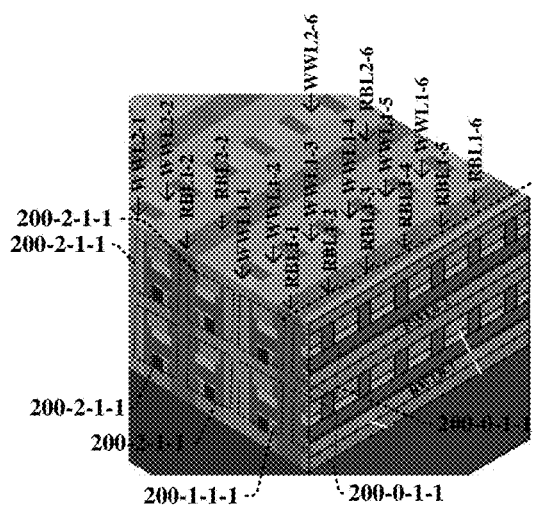
Figure 8:
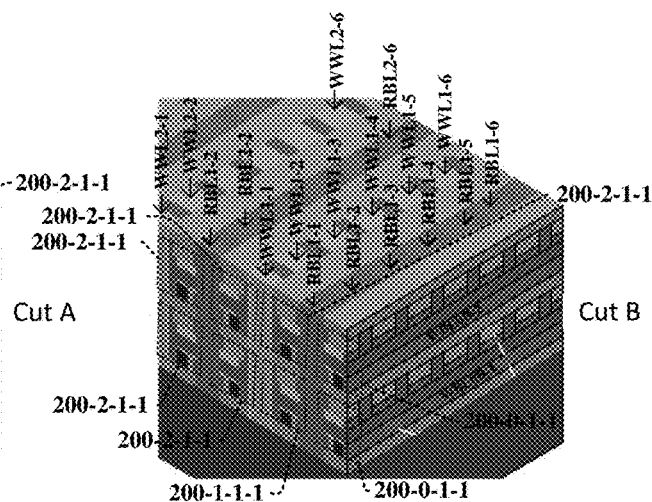

FIG. 5 shows a schematic view of a three-dimensional array including sixteen memory cells organized in two aisles of eight memory cells, with each aisle containing eight memory cells arranged in two rows and four columns. FIG. 6 depicts a cross-sectional view of an aisle of eight memory cells consistent with FIG. 5's schematic, and FIGS. 7-8 depict various perspective cutaway views of the three-dimensional array of FIG. 5 (along with additional memory cells in additional aisles) with cutaways as indicated in FIG. 6. As shown in FIGS. 5-8, in these embodiments write word lines (WWL) and read bitline (RBL) extend vertically and alternatingly between stacks of memory cells. The WWLs are coupled to gates of the neighboring write transistors, and the RBLs are coupled to drains of the neighboring read transistors. Read Wordlines (RWL) and Write Bitlines (WBL) extend continuously into the page between neighboring aisles of memory cells, and are operably coupled as shown.

Turning now to FIGS. 9-29, one can see a series of cross-sectional views and corresponding perspective views that illustrate a method of manufacturing a memory device in accordance with some embodiments.

Figure 9:
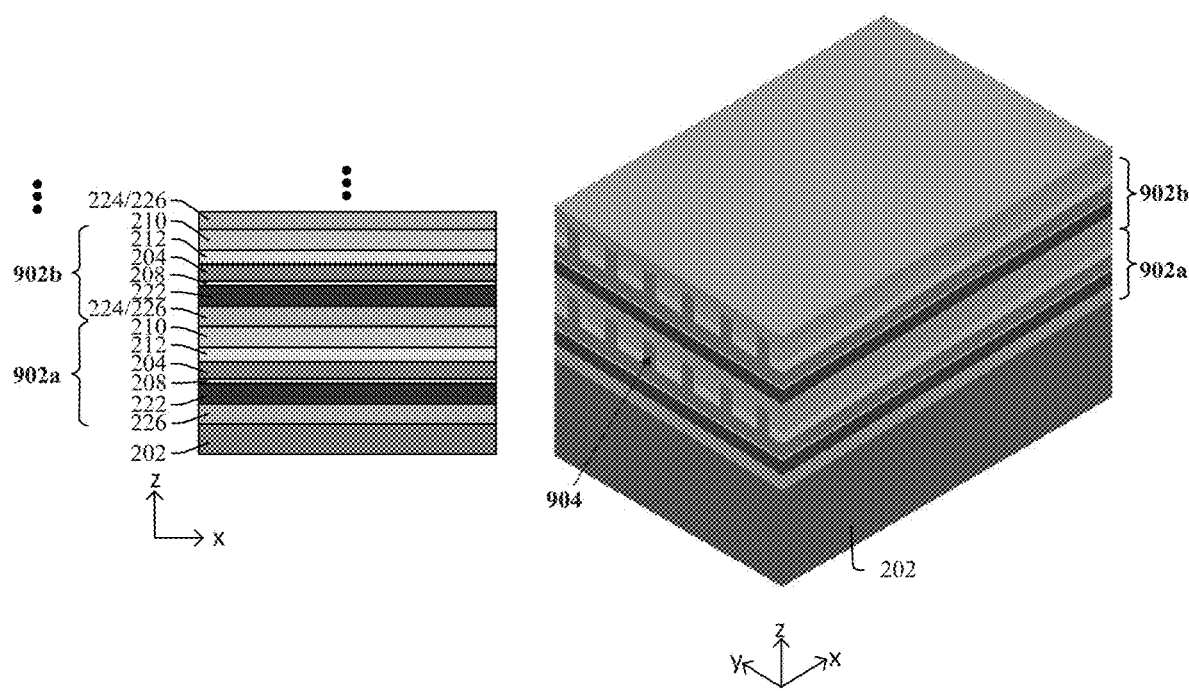

In FIG. 9, a number of layers are deposited over a semiconductor substrate 202. The layers may include multiple memory stacks (e.g., first memory stack 902a, second memory stack 902b, . . . ) that are stacked over one another, wherein each memory stack includes a lower dielectric isolation layer 226, an oxide layer 222, a gate dielectric layer 208, a body layer 204, a capacitor dielectric layer 212, an upper capacitor metal layer 210, and an upper dielectric isolation layer 226 (which may be merged with or one in the same as the lower dielectric isolation layer 224 for higher memory stacks). In some embodiments, the bottom-most memory stack (e.g., 902a) is optionally separated from the semiconductor substrate 202 by the dielectric isolation region 226, which may be a standalone layer or may include in a back-end-of-line (BEOL) interconnect structure that includes multiple dielectric layers and horizontal wiring layers and vertical vias that are coupled to semiconductor devices (e.g., transistors) in the semiconductor substrate 202. Dielectric walls 904 are also disposed in the structure to provide isolation between neighboring regions of the memory stacks in the y-direction).

Figure 10:
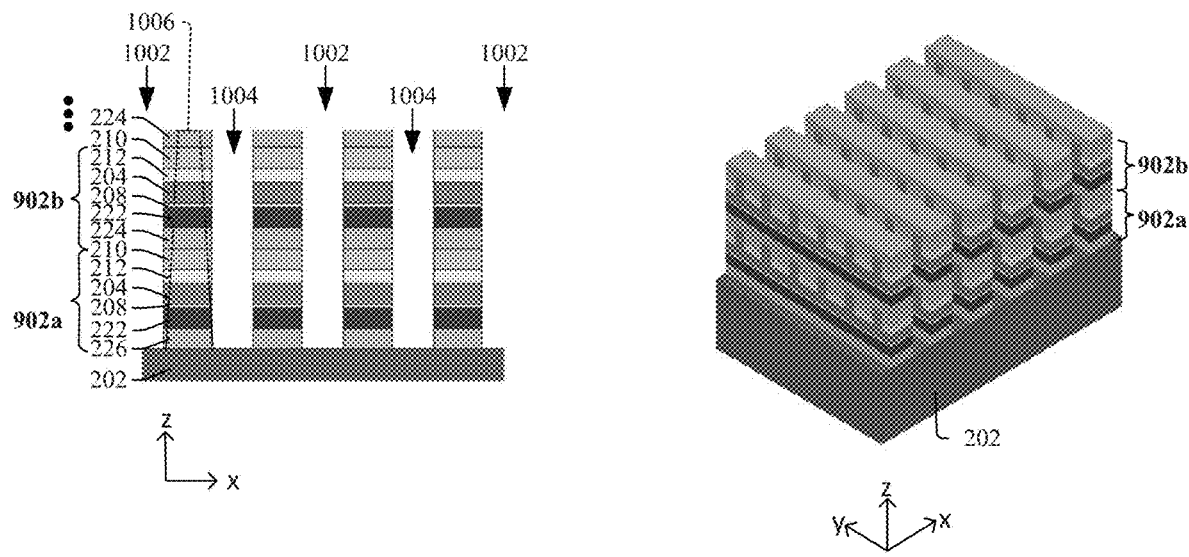

In FIG. 10, a first mask (not shown), such as a photomask is patterned over the uppermost memory stack (e.g., 902b), and a first vertical etch is carried out with the first mask in place. Thus, the first vertical etch can be a wet etch or dry etch can proceed down to the substrate 202. As such, in FIG. 10, six aisles of patterned memory stack structures are formed and are separated from one another by RBL trenches 1002 and WWL trenches 1004, though it will be appreciated that in general any number of memory stack structures can be formed. Each patterned memory stack structure can include a lower dielectric isolation layer 226, an oxide layer 222, a gate dielectric layer 208, a body layer 204, a capacitor dielectric layer 212, an upper capacitor metal layer 210, and an upper dielectric isolation layer 226 (which may be merged with or one in the same as the lower dielectric isolation layer 224 for higher memory stacks). Whereas the structure in FIG. 10 illustrates vertical sidewalls, the first vertical etch can also have a slight lateral component resulting in sidewalls that are slanted such that structures nearer the substrate 202 are wider, and structures further from the substrate 202 are narrower (see lines 1006). The same is true of other etches presented herein.

Figure 11:
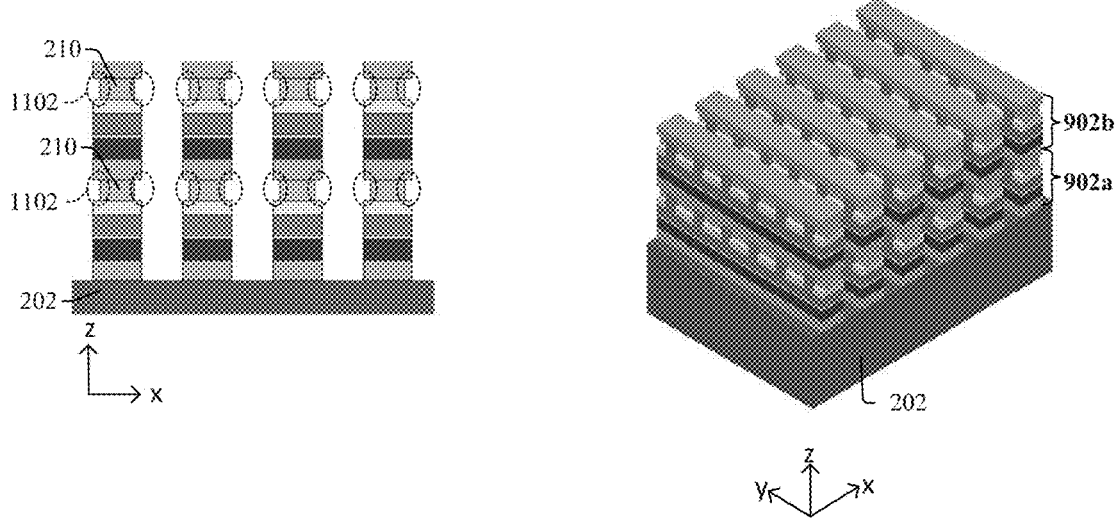

In FIG. 11, with the first mask still in place, a first lateral etch, such as a wet etch for example, is carried out to remove outermost portions of the upper capacitor metal region in each memory stack structure, and forming first recesses 1102. In some embodiments, the first lateral etch can comprise SC1 (a mixture of $NH_4OH$ and $H_2O_2$), SC2 (a mixture of HCl and $H_2O_2$) and/or SPM (a mixture of $H_2SO_4$ and $H_2O_2$) in the case for TiN. Thus, the first lateral etch can be selective to remove the outermost portions of the upper capacitor metal regions while leaving the other layers of the stack substantially in place.

Figure 12:
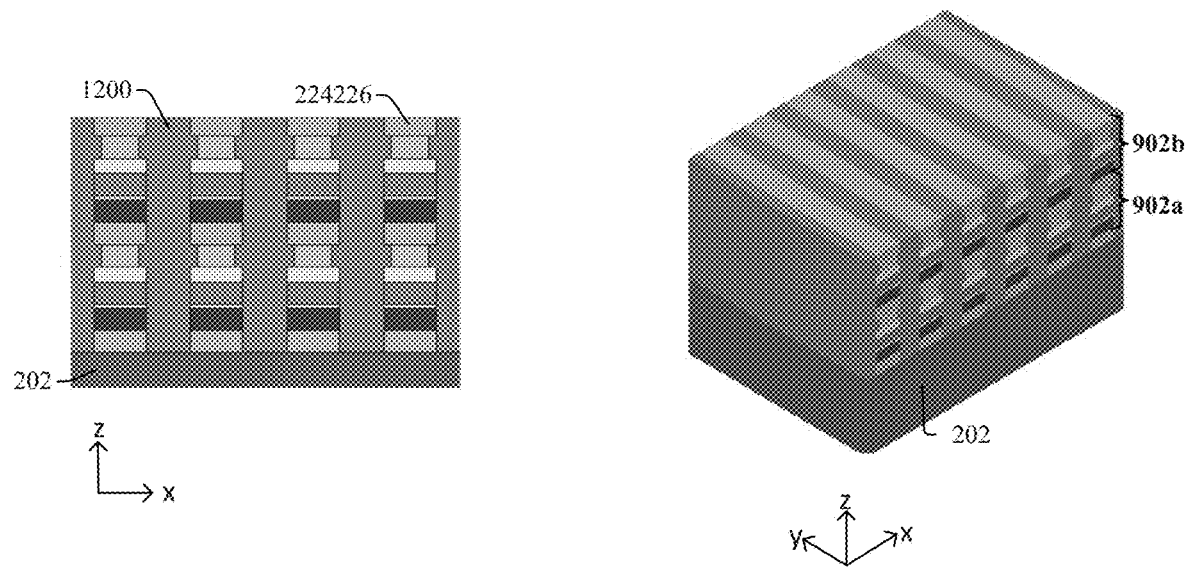

In FIG. 12, a dielectric 1200 is formed over an upper surface of the memory stack regions, along sidewalls of the memory stack regions, and over an exposed upper surface of the semiconductor substrate between the memory stack regions. In some embodiments, the dielectric 1200 entirely fills the RBL trenches 1002 and WWL trenches 1004. The dielectric 1200 can comprise silicon dioxide in some embodiments, but can also be a low-k dielectric in other embodiments. A CMP may be performed after dielectric 1200 is formed so upper surface of dielectric 1200 is planarized with the upper surface of isolation layer 224/226.

Figure 13:
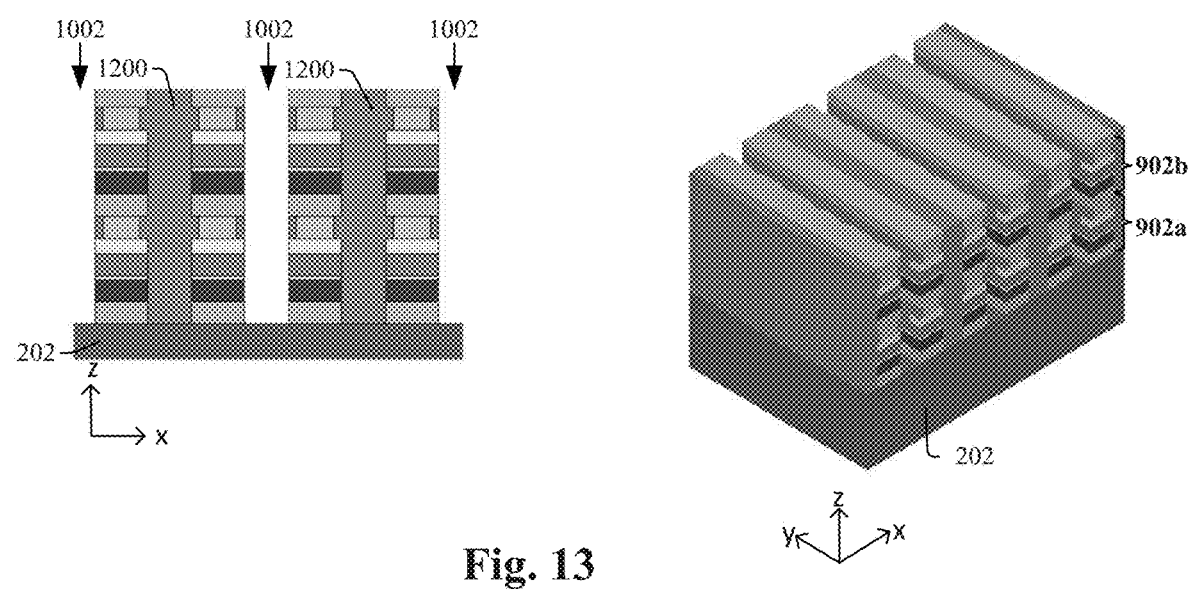

In FIG. 13, a second mask (not shown), such as a photomask is patterned over the uppermost memory stack, and a wet or dry etch is carried out with the second mask in place to re-open the RBL trenches 1002 by removing the dielectric 1200 from those trenches, while leaving the WWL trenches filled with dielectric 1200. The wet etch or dry etch can proceed down to the substrate 202.

Figure 14:
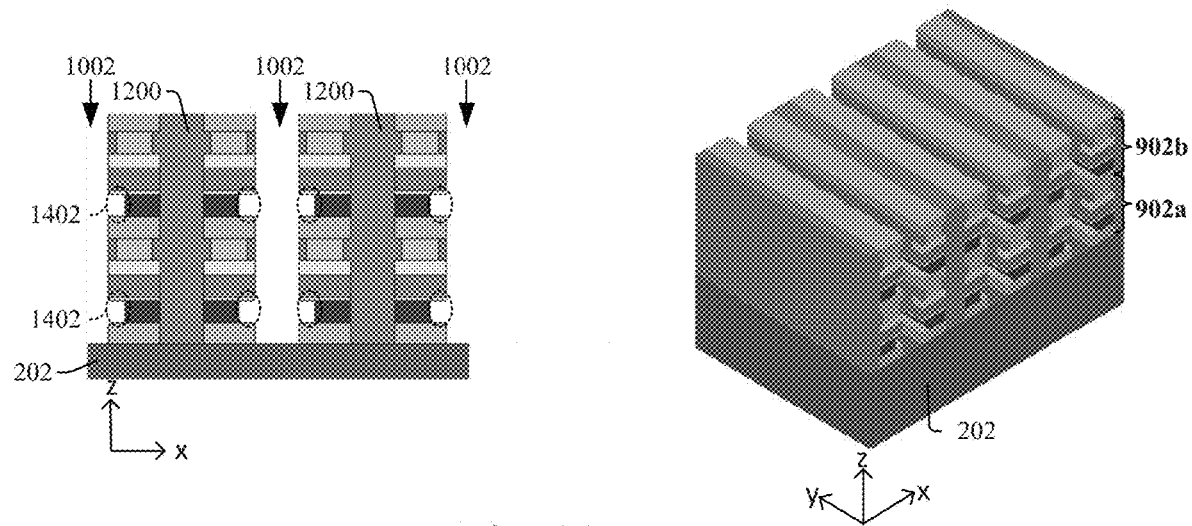

In FIG. 14, a second lateral etch is carried out to remove an outermost portion of the dielectric 1200 from the re-opened RBL trenches, thereby forming recesses 1402 in outer edges of the re-opened RBL trenches. In some embodiments, this second lateral etch is a wet etch or a dry etch and comprises a halogen, such as fluorine.

Figure 15:
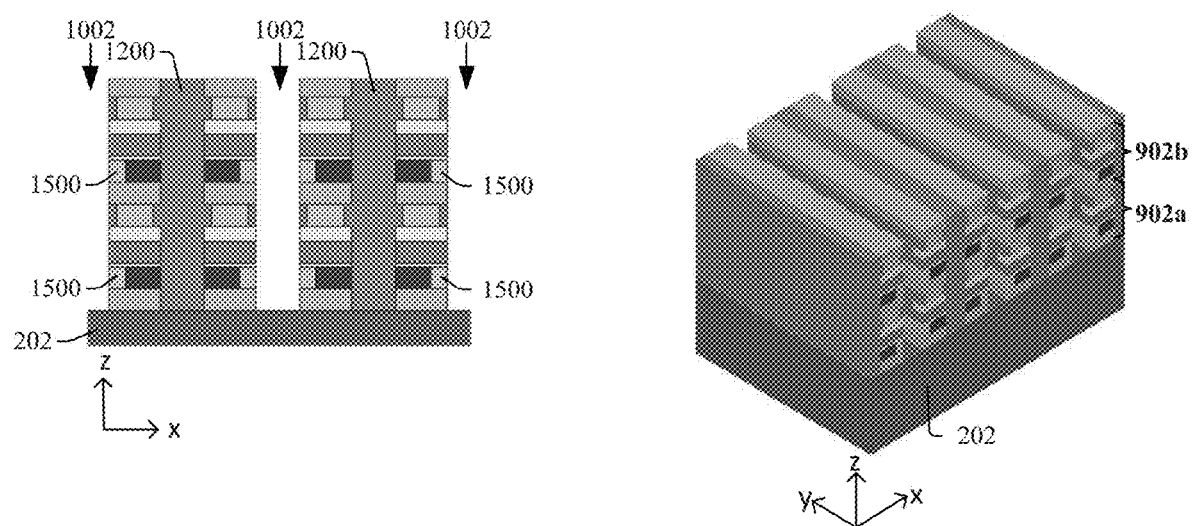

In FIG. 15, a conductive material 1500 is deposited to fill in the re-opened RBL trenches and to fill in the corresponding recesses. In some embodiments, the conductive material 1500 is formed by a physical deposition process, such as sputtering, electroplating, atomic layer deposition, or physical vapor deposition. In some embodiments, the conductive material 1500 is a metal, and can comprise ruthenium, or tungsten because of tungsten's good fill properties and affinity for filling small gaps without forming voids. Further in FIG. 15, after the conductive material has been formed to fill the re-opened RBL trenches and corresponding recesses, a vertical metal etch is performed to re-open the RBL trenches while leaving the conductive material 1500 in the recesses, as shown in FIG. 15.

Figure 16:
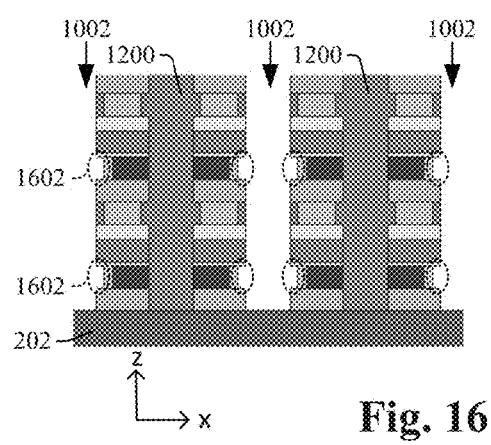
Figure 16:
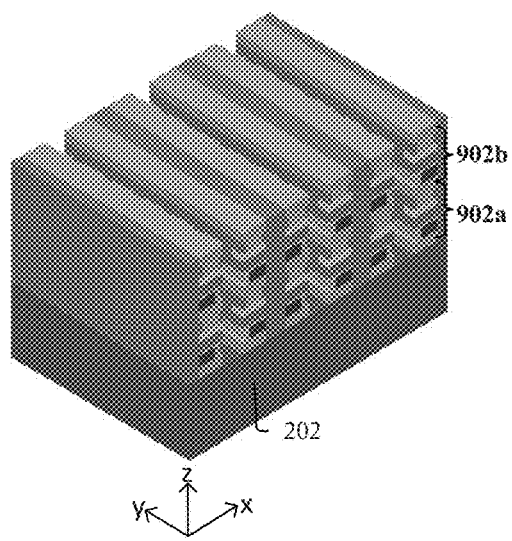

In FIG. 16, a third lateral etch is carried out to remove an outermost portion of the conductive material 1500 from the recesses, thereby forming shallow recesses 1602 in outer edges of the RBL trenches 1002. In some embodiments, this third lateral etch is a wet etch or a dry etch and comprises fluorine.

Figure 17:
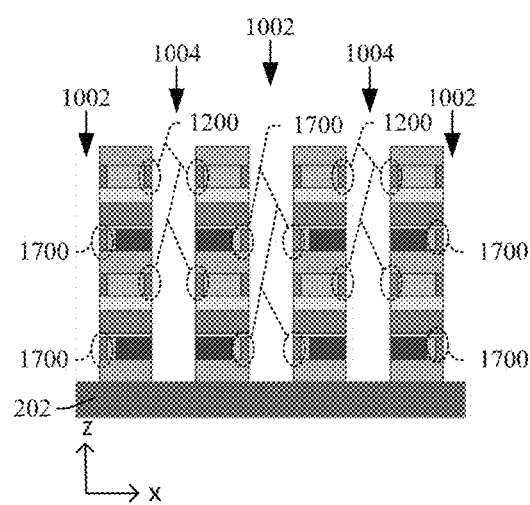
Figure 17:
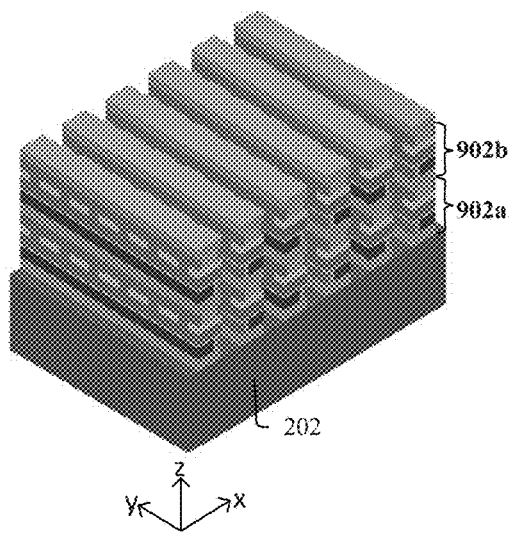

In FIG. 17, a dielectric is formed to entirely or partially fill the re-opened RBL trenches 1002 and the shallow recesses 1602 of FIG. 16. The dielectric can comprise silicon dioxide in some embodiments, but can also be a low-k dielectric in other embodiments. After the dielectric is formed to fill the re-opened RBL trenches and the shallow recesses, a vertical etch is performed to re-open the RBL trenches 1002 and the WWL trenches 1004, while leaving dielectric material 1700 in the shallow recesses (1602 of FIG. 17), and leaving dielectric material 1200 along other sidewalls of the memory stacks. In some embodiments dielectric material 1700 and dielectric material 1200 may be the same composition as one another, but in other embodiments may have different composition from one another.

In FIG. 18, a conductive material 1800 is deposited to fill in the re-opened RBL trenches 1002 and the re-opened WWL trenches 1004. Thus, the conductive material 1800 corresponds to read bitlines (e.g., 116 in FIG. 1). In some embodiments, the conductive material 1800 is formed by a physical deposition process, such as sputtering, electroplating, atomic layer deposition, or physical vapor deposition. In some embodiments, the conductive material 1800 is a metal, and can comprise tungsten because of tungsten's good fill properties and affinity for filling small gaps without forming voids.

In FIG. 19, a third mask (not shown), such as a photomask is patterned over the uppermost memory stack, and a wet or dry etch is carried out with the third mask in place to re-open the WWL trenches 1004 by removing the conductive material 1800 from those WWL trenches 1004 while the conductive material 1800 remains in the RBL trenches. The wet etch or dry etch can proceed down to the substrate 202.

Figure 20:
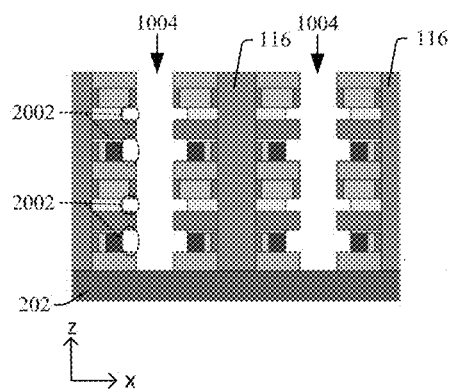
Figure 20:
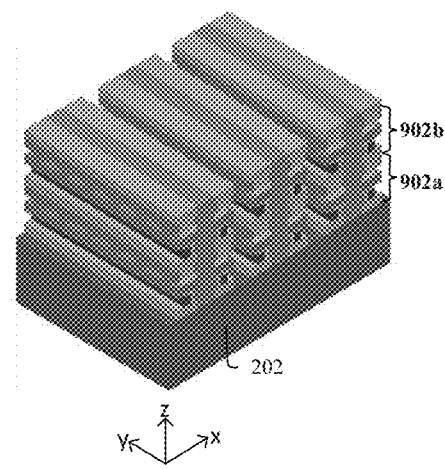

In FIG. 20, a fourth lateral etch is carried out to remove outermost portions of the oxide layer 222, a gate dielectric layer 208, and capacitor dielectric layer 212 nearest the WWL trenches 1004, thereby forming recesses 2002 in outer edges of the WWL trenches. In some embodiments, this fourth lateral etch is a wet etch or a dry etch and comprises fluorine. In some embodiments, the fourth etch is based on a remote plasma process including two main steps referred to as an etch step and an anneal step. During the etch step of the two main steps, fluorosilicate salts are generated on the wafer through the reaction of NH4F reactive species with the outermost portions of the oxide layer 222. Then, during the anneal step of the two main steps, the fluorosilicate salts sublimate to permit the selective etching of the oxide layer 222 over the substrate 202 and further dielectric regions 224 and 226 (e.g., nitride).

Figure 21:
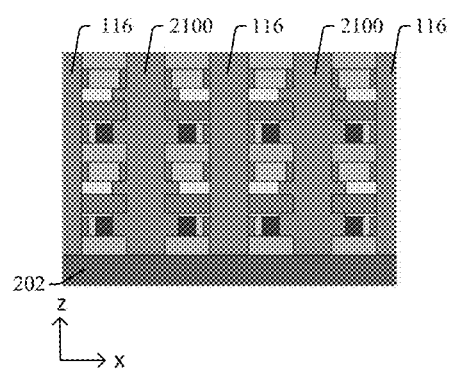
Figure 21:
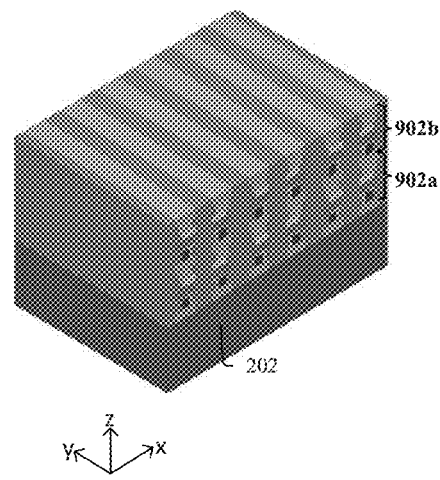

In FIG. 21, a conductive material 2100 is deposited to fill in the re-opened WWL trenches 1004 and to fill in the corresponding recesses 2002 of FIG. 20. In some embodiments, the conductive material 2100 is formed by a physical deposition process, such as sputtering, electroplating, atomic layer deposition, or physical vapor deposition. In some embodiments, the conductive material 2100 is a metal, and can comprise tungsten because of tungsten's low resistivity, good fill properties, and affinity for filling small gaps without forming voids. The conductive material 2100 can be the same composition or a different composition from the conductive material 1800 depending on the implementation.

Figure 22:
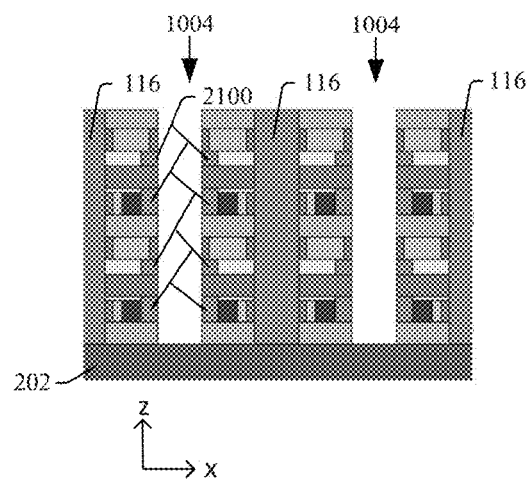
Figure 22:
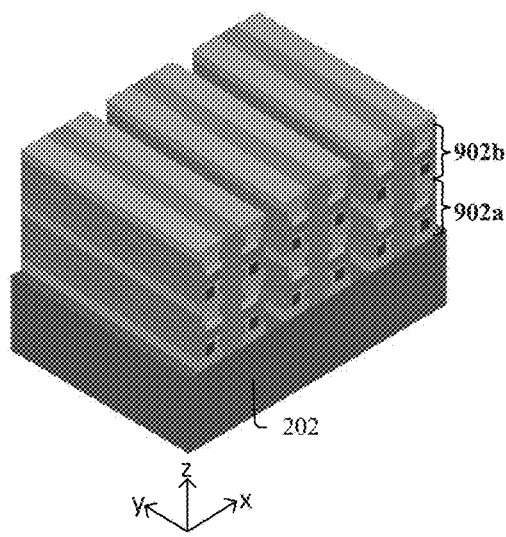

In FIG. 22, a fourth mask (not shown) is formed and a vertical etch is performed with the fourth mask in place to re-open the WWL trenches 1004 while leaving regions of the conductive material 2100 in place along sidewalls of the memory stacks nearest the WWL tranches 1004. The fourth mask covers the conductive material 1800 such that the conductive material 1800 is left in the RBL trenches.

Figure 23:
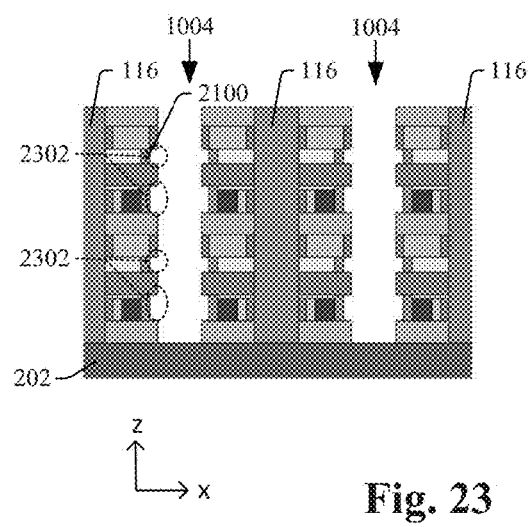
Figure 23:
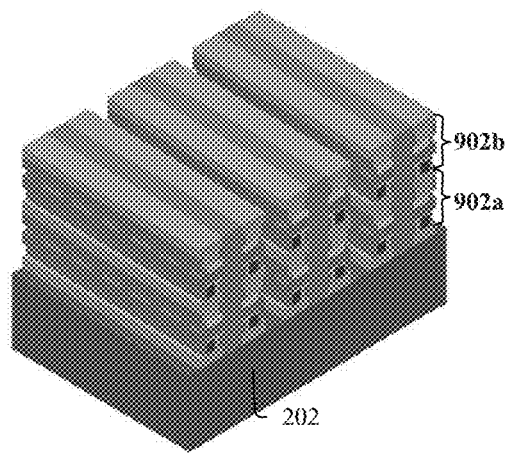

In FIG. 23, a fifth lateral etch is carried out to remove outermost portions of the conductive material 2100 nearest the WWL trenches, thereby forming recesses 2302 in outer edges of the WWL trenches 1004. In some embodiments, this fifth lateral etch is a wet etch or a dry etch and comprises fluorine.

Figure 24:
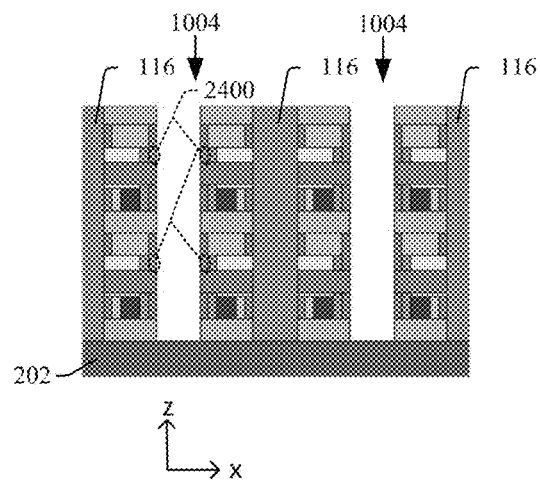
Figure 24:
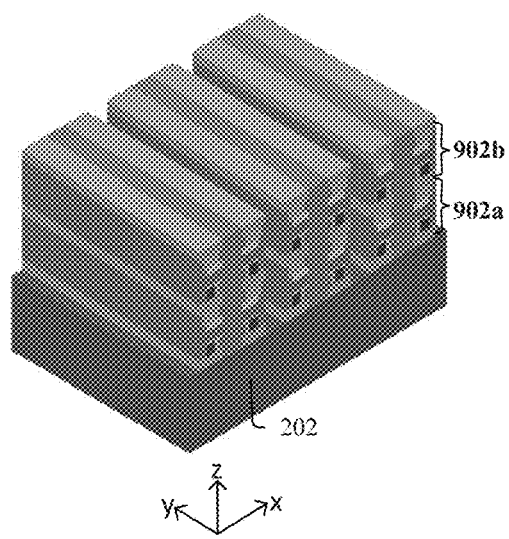

In FIG. 24 a dielectric is formed to entirely or partially fill the re-opened WLL trenches 1004 and the corresponding recesses 2302. The dielectric can comprise silicon dioxide in some embodiments, but can also be a low-k dielectric in other embodiments. After the dielectric is formed to fill the re-opened WLL 1004 trenches and the corresponding recesses, a vertical etch is performed to re-open the WWL trenches, while leaving dielectric material 2400 in the corresponding recesses.

Figure 25:
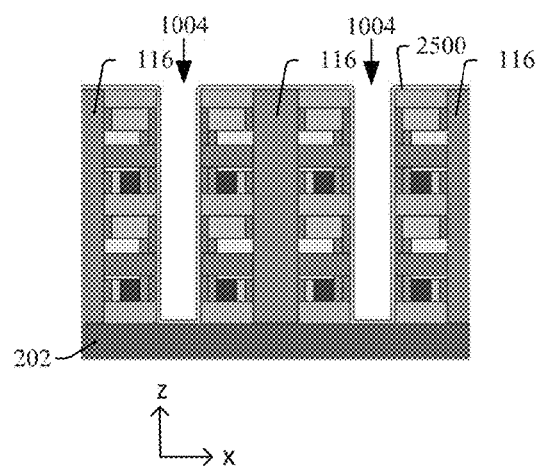
Figure 25:
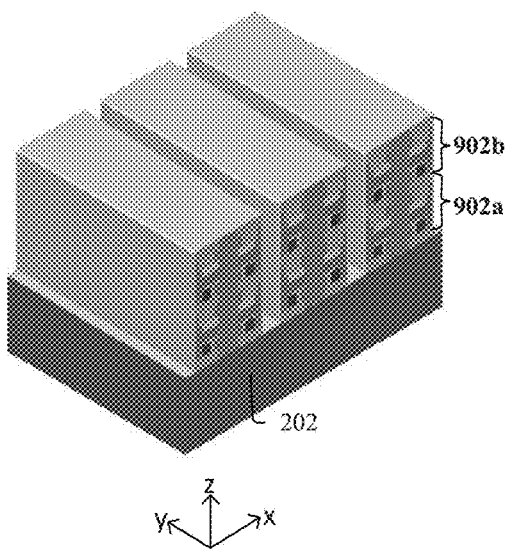

In FIG. 25, a high-k material 2500 is formed over the structure. In some embodiments, the high-k material is a conformal dielectric that lines bottom surfaces and sidewalls of the WWL trenches 1004 and extends over the top surfaces of the structure.

Figure 26:
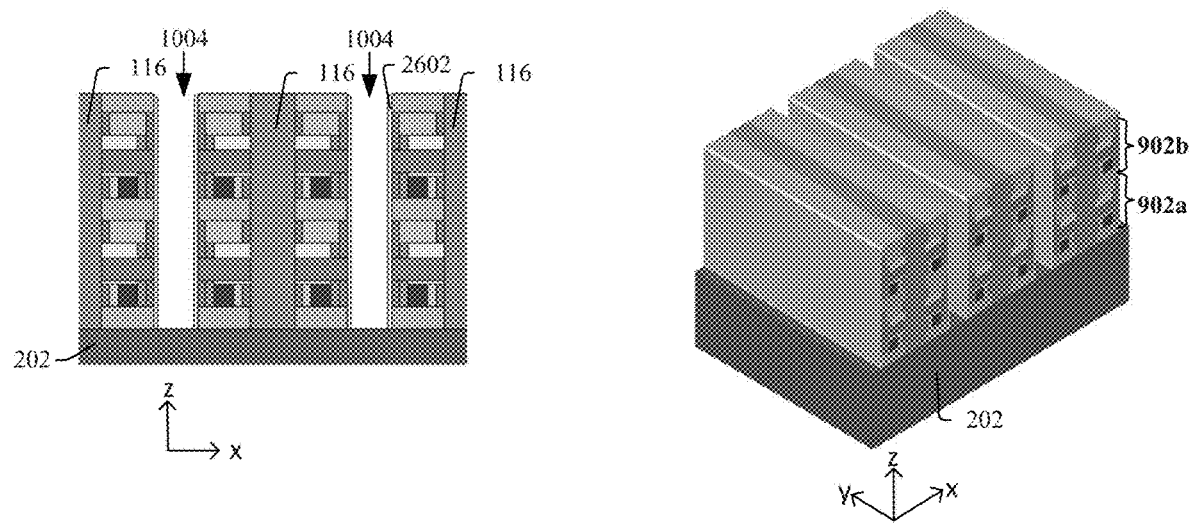

In FIG. 26, a high-k material is etched back, for example using a vertical etch such as a dry etch to remove the lateral portions of the high-k material while leaving the high-k material 2602 on sidewalls of the WWL trenches 1004.

Figure 27:
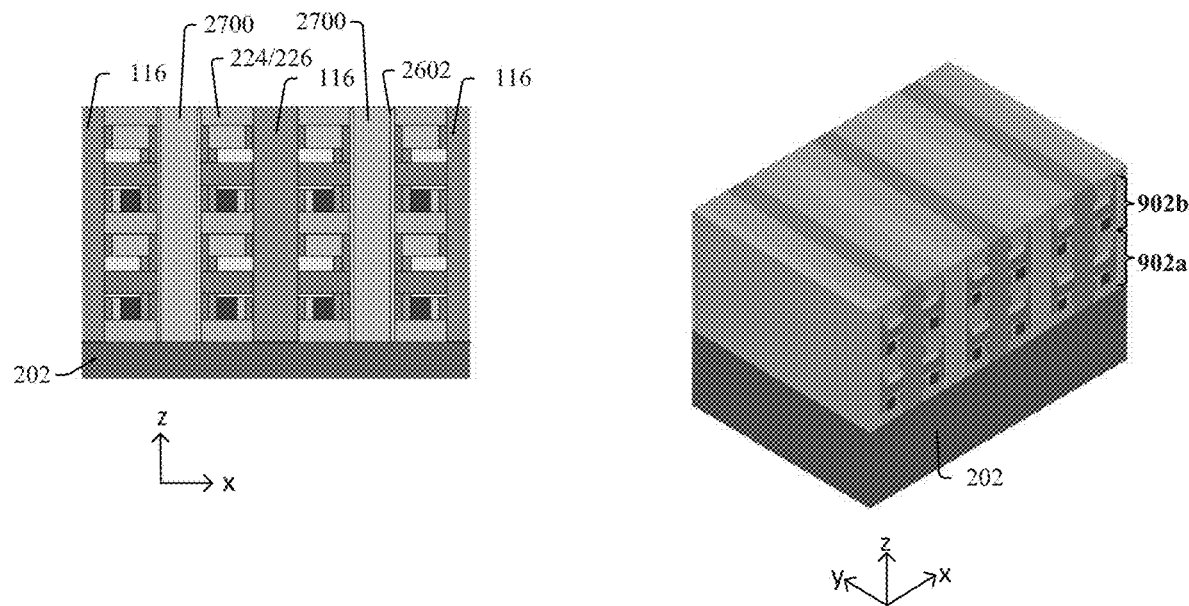

In FIG. 27, a conductive material 2700 is deposited to fill in the re-opened WWL trenches 1004 over the high-k material 2602. In some embodiments, the conductive material 2700 is formed by a physical deposition process, such as sputtering, electroplating, atomic layer deposition, or physical vapor deposition. In some embodiments, the conductive material 2700 is a metal, and can comprise tungsten because of tungsten's good fill properties and affinity for filling small gaps without forming voids. A CMP may be performed after conductive material 2700 is formed so upper surface of conductive material 2700 is planarized with the upper surface of isolation layer 224/226.

Figure 28:
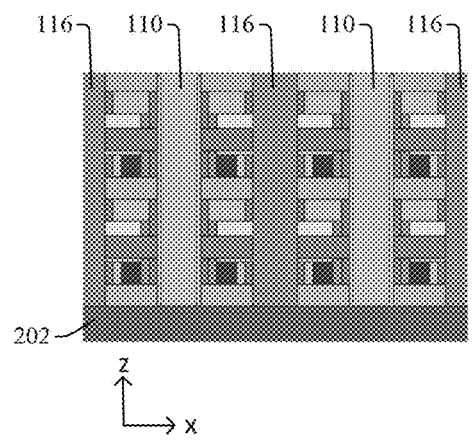
Figure 28:
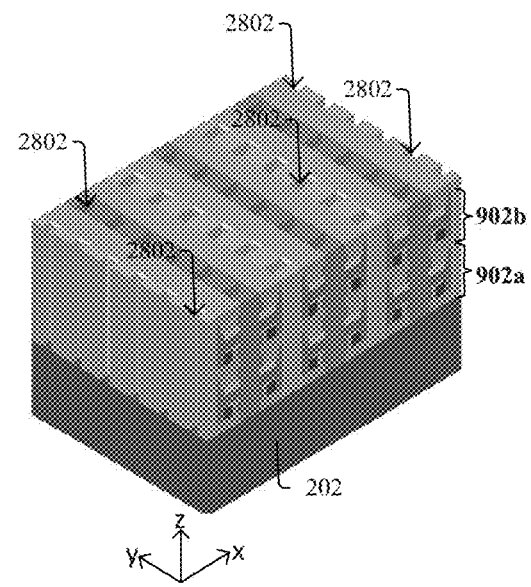

In FIG. 28, a cell isolation process is performed to form shafts 2802 to isolate the WWLs 110 of the various memory cells from one another. Thus, in FIG. 28, a fifth mask (not shown) is formed, and with the fifth mask in place, an etch is performed to form the shafts 2802 that segment the conductive material 2700 into separate WWLs 110 as shown.

Figure 29:
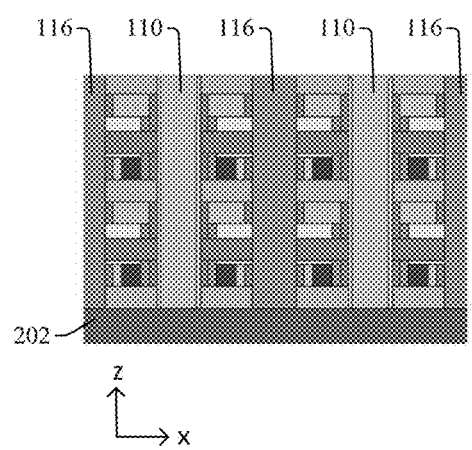
Figure 29:
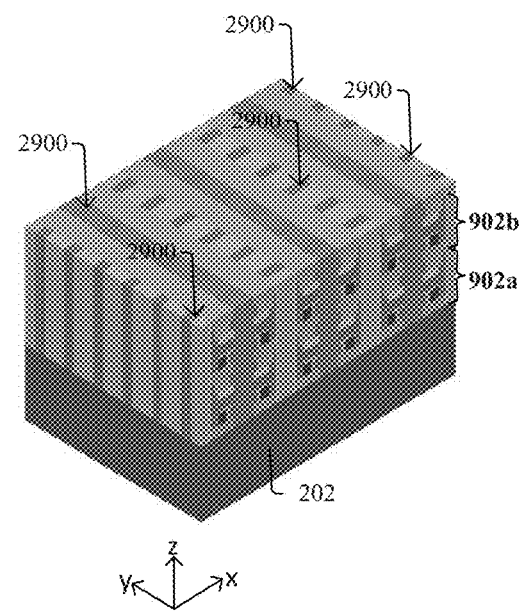

In FIG. 29, columnar dielectric regions 2900 are formed to entirely or partially fill the shafts. The columnar dielectric regions 2900 can comprise silicon dioxide in some embodiments, but can also be a low-k dielectric in other embodiments. After the columnar dielectric regions are formed a CMP process is performed to planarize the upper surface of the structure.

Figure 30:
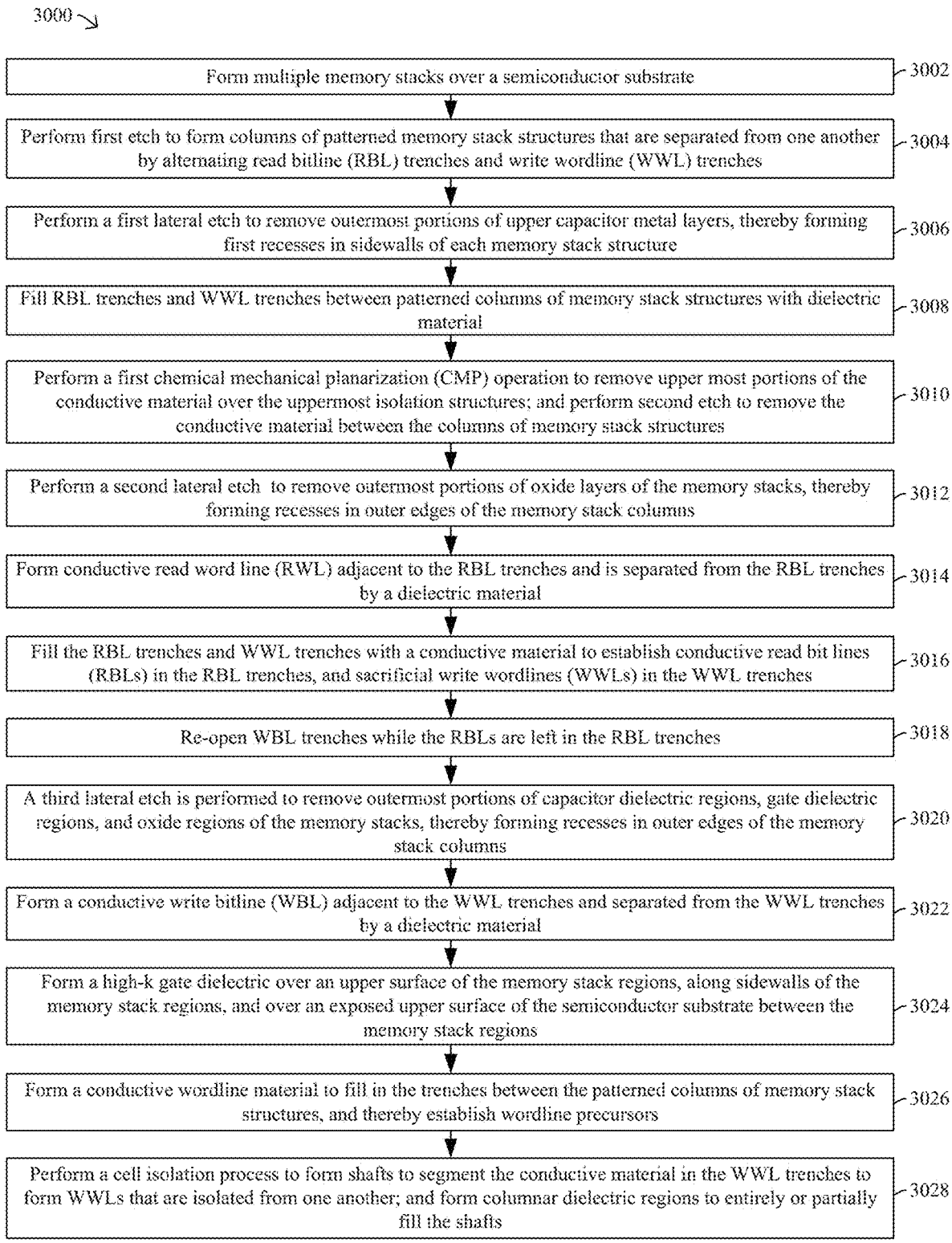
FIG. 30 depicts a flow chart that depicts a manufacturing flow in accordance with some embodiments.

FIG. 30 illustrates a methodology 3000 of forming a memory device in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

In act 3002, multiple memory stacks are formed over a semiconductor substrate. Each memory stack includes a lower dielectric isolation layer, an oxide layer over the lower dielectric isolation layer, a gate dielectric layer over the oxide layer, a body layer over the gate dielectric layer, a capacitor dielectric layer over the body layer, an upper capacitor metal layer over the capacitor dielectric layer, and an upper dielectric isolation layer over the upper capacitor metal layer (wherein the upper dielectric isolation layer may be merged with or one in the same as the lower dielectric isolation layer for higher memory stacks). Thus, some embodiments of act 3002 correspond, for example to FIG. 9.

In act 3004, wet or dry etch is carried out with to form columns of patterned memory stack structures that are separated from one another by alternating RBL trenches and WWL trenches. Thus, some embodiments of act 3004 correspond, for example to FIG. 10.

In act 3006, a first lateral etch is performed to remove outermost portions of the upper capacitor metal layer in each memory stack structure, thereby forming recesses in sidewalls of the patterned memory stack structures. Thus, some embodiments of act 3006 correspond, for example to FIG. 11.

In act 3008, the RBL trenches and the WWL trenches between patterned columns of memory stack structures are filled with dielectric material. Thus, some embodiments of act 3008 correspond, for example to FIG. 12.

In act 3010, the RBL trenches are re-opened while the dielectric material is left in the WWL trenches. Thus, some embodiments of act 3010 correspond, for example to FIG. 13.

In act 3012, a second lateral etch is performed to remove outermost portions of oxide layers of the memory stacks, thereby forming recesses in outer edges of the memory stack columns. Thus, some embodiments of act 3012 correspond, for example to FIG. 14.

In act 3014, conductive read word line (RWL) is formed adjacent to the RBL trenches and is separated from the RBL trenches by a dielectric material. Thus, some embodiments of act 3014 correspond, for example, to FIGS. 15-17.

In act 3016, a conductive material is formed to establish conductive read bit lines (RBLs) in the RBL trenches, and sacrificial write wordlines (WWLs) in the WWL trenches. Thus, some embodiments of act 3016 correspond, for example, to FIG. 18.

In act 3018, the WBL trenches are re-opened while the RBLs are left in the RBL trenches. Thus, some embodiments of act 3018 correspond, for example to FIG. 19.

In act 3020, a third lateral etch is performed to remove outermost portions of capacitor dielectric regions, gate dielectric regions, and oxide regions of the memory stacks, thereby forming recesses in outer edges of the memory stack columns. Thus, some embodiments of act 3020 correspond, for example to FIG. 20.

In act 3022, a conductive write bitline (WBL) is formed adjacent to the WWL trenches and is separated from the WWL trenches by a dielectric material. Thus, some embodiments of act 3022 correspond, for example, to FIGS. 21-24.

In act 3024, a high-k gate dielectric is formed over an upper surface of the memory stack regions, along sidewalls of the memory stack regions, and over an exposed upper surface of the semiconductor substrate between the memory stack regions. Thus, some embodiments of act 1718 correspond, for example to FIG. 25.

In act 3026, the high-k gate dielectric is etched back, and a conductive material is formed in the WWL trenches. Thus, some embodiments of act 3026 correspond, for example to FIGS. 26-27.

In act 3028, a cell isolation process is performed to form shafts to segment the conductive material in the WWL trenches to form WWLs that are isolated from one another; and columnar dielectric regions are formed to entirely or partially fill the shafts. Thus, some embodiments of act 3028 correspond, for example to FIGS. 28-29.

Thus, some embodiments relate to a memory device that includes a plurality of memory cells. A first memory cell of the plurality of memory cells includes a first write transistor includes a first write gate, a first write source, and a first write drain. A first read transistor includes first read gate, a first read source, a first read drain, and a first body region separating the first read source from the first read drain. The first read source is coupled to the first write source. A first capacitor has a first upper capacitor plate coupled to the first write drain and a first lower capacitor plate coupled to the first body region of the first read transistor.

Other embodiments relate to a semiconductor memory structure disposed on a semiconductor substrate. A first body region is disposed over an upper surface of the semiconductor substrate, and a first write wordline extends along a first side of the first body region. The write wordline is separated from the first side of the first body region by a first write wordline gate dielectric. A first read bitline extends along a second side of the first body region opposite the first side and is coupled to the first body region. A first write bitline is disposed between the upper surface of the semiconductor substrate and a lower surface of the first body region, and is disposed between the first write wordline and the first read bitline. A first read wordline is disposed between the upper surface of the semiconductor substrate and the lower surface of the first body region, and is disposed between the first write bitline and the first read bitline. The first read wordline is separated from the lower surface of the first body region by a first read wordline gate dielectric; and a first capacitive element is disposed over an upper surface of the first body region and disposed between the first write wordline and the first read bitline. The first capacitive element is configured to selectively store varying levels of charge corresponding to varying data states on the first body region.

Some embodiments relate to a method. In the method, multiple memory stacks are stacked over one another and are stacked over a semiconductor substrate. An etch is performed to pattern the memory stacks into multiple columns of memory stack structures, wherein read bitline (RBL) trenches and write wordline (WWL) trenches are on opposite sides of the columns of multiple columns of memory stack structures to separate the multiple columns of memory stack structures from one another. A first lateral etch is performed to remove outermost conductive regions from each memory stack structure, thereby forming first recesses in sidewalls of each memory stack structure. The RBL trenches, the WWL trenches, and the first recesses are filled with dielectric material. The RBL trenches are re-opened while the WWL trenches are left filled with the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising a plurality of memory cells, wherein a first memory cell of the plurality of memory cells comprises:
   a first write transistor comprising a first write gate, a first write source, and a first write drain; and
   a first read transistor comprising first read gate, a first read source, a first read drain, and a first body region separating the first read source from the first read drain, wherein the first read source is coupled to the first write source; and
   a first capacitor having a first upper capacitor plate in direct electrical connection with only the first write drain and a first lower capacitor plate in direct electrical connection with only the first body region of the first read transistor.

2. The memory device of claim 1, wherein a second memory cell of the plurality of memory cells is disposed alongside the first memory cell and comprises:
   a second write transistor comprising a second write gate, a second write source, and a second write drain; and
   a second read transistor comprising second read gate, a second read source, a second read drain, and a second body region separating the second read source from the second read drain, wherein the second read source is coupled to the second write source;
   a second capacitor having a second upper capacitor plate coupled to the second write drain and a second lower capacitor plate coupled to the second body region of the second read transistor; and
   a first write wordline extending between the first memory cell and the second memory cell, the first write wordline coupled to the first write gate and the second write gate and the first and second memory cells being mirror images of one another about the first write wordline.

3. The memory device of claim 1, wherein a second memory cell of the plurality of memory cells is disposed over the first memory cell and comprises:
   a second write transistor comprising a second write gate, a second write source, and a second write drain; and
   a second read transistor comprising second read gate, a second read source, a second read drain, and a second body region separating the second read source from the second read drain, wherein the second read source is coupled to the second write source;
   a second capacitor having a second upper capacitor plate coupled to the second write drain and a second lower capacitor plate coupled to the second body region of the second read transistor; and
   a first write wordline extending alongside the first memory cell and the second memory cell, the first write wordline coupled to the first write gate and the second write gate.

4. A semiconductor memory structure, comprising:
   a semiconductor substrate;
   a first body region having a lower surface disposed over an upper surface of the semiconductor substrate and having an upper surface over the lower surface of the first body region;
   a first write wordline extending upwardly and substantially perpendicularly from the upper surface of the semiconductor substrate, past the lower surface of the first body region, along a first side of the first body region, and past the upper surface of the first body region, the first write wordline being separated from the first side of the first body region by a first write wordline gate dielectric;
   a first read bitline extending along a second side of the first body region opposite the first side and coupled to the first body region;
   a first write bitline disposed between the upper surface of the semiconductor substrate and a lower surface of the first body region, and disposed between the first write wordline and the first read bitline;
   a first read wordline disposed between the upper surface of the semiconductor substrate and the lower surface of the first body region, and disposed between the first write bitline and the first read bitline, the first read wordline being separated from the lower surface of the first body region by a first read wordline gate dielectric; and
   a first capacitive element disposed over an upper surface of the first body region and disposed between the first write wordline and the first read bitline, the first capacitive element configured to selectively store varying levels of charge corresponding to varying data states on the first body region.

5. The semiconductor memory structure of claim 4, wherein the first read bitline extends vertically and continuously from an upper surface of the first capacitive element to a position level with a bottom surface of the first write bitline or level with a bottom surface of the first read wordline.

6. The semiconductor memory structure of claim 4, wherein the first write wordline extends vertically and continuously from an upper surface of the first capacitive element to a position level with a bottom surface of the first write bitline or level with a bottom surface of the first read wordline.

7. The semiconductor memory structure of claim 4, further comprising:
   a second body region disposed over an upper surface of the first capacitive element;
   wherein the first write wordline extends along a first side of the second body region, the first write wordline being separated from the first side of the second body region by the first write wordline gate dielectric; and wherein the first read bitline extends along a second side of the second body region opposite the first side of the second body region and is coupled to the second body region.

8. The semiconductor memory structure of claim 7, further comprising:

a second write bitline disposed between the upper surface of the first capacitive element and a lower surface of the second body region, and disposed between the first write wordline and the first read bitline;

a second read wordline disposed between the upper surface of the first capacitive element and the lower surface of the second body region, and disposed between the first write bitline and the first read bitline, the second read wordline being separated from the lower surface of the second body region by a second read wordline gate dielectric; and a second capacitive element disposed over an upper surface of the second body region and disposed between the first write wordline and the first read bitline, the second capacitive element configured to selectively store varying levels of charge corresponding to varying data states on the second body region.

9. The semiconductor memory structure of claim 4, further comprising:

a third body region disposed over the upper surface of the semiconductor substrate and to a second side of the first read bitline, wherein the first read bitline is coupled to a first side of the third body region and separates the first body region and the third body region; and a second write wordline extending along a second side of the third body region opposite the first side of the third body region, the second write wordline being separated from the second side of the third body region by a second write wordline gate dielectric.

10. The semiconductor memory structure of claim 9, further comprising:

a third write bitline disposed between the upper surface of the semiconductor substrate and a lower surface of the third body region, and disposed between the first read bitline and the second write wordline;

a third read wordline disposed between the upper surface of the semiconductor substrate and the lower surface of the third body region, and disposed between the first read bitline and the third write bitline, the third read wordline being separated from the lower surface of the third body region by a third read wordline gate dielectric; and a third capacitive element disposed over an upper surface of the third body region and disposed between the first read bitline and the second write wordline, the third capacitive element configured to selectively store varying levels of charge corresponding to varying data states on the third body region.

11. The semiconductor memory structure of claim 4, further comprising:

a fourth body region disposed over the upper surface of the semiconductor substrate and to a side of the first write wordline opposite the first body region; and a second read bitline extending along a side of the fourth body region furthest from the first body region and coupled to the fourth body region.

12. The semiconductor memory structure of claim 11, further comprising:

a fourth write bitline disposed between the upper surface of the semiconductor substrate and a lower surface of the fourth body region, and disposed between the first write wordline and the second read bitline;

a fourth read wordline disposed between the upper surface of the semiconductor substrate and the lower surface of the fourth body region, and disposed between the first write wordline and the second read bitline, the fourth read wordline being separated from the lower surface of the fourth body region by a fourth read wordline gate dielectric; and a fourth capacitive element disposed over an upper surface of the fourth body region and disposed between the first write wordline and the second read bitline, the fourth capacitive element configured to selectively store varying levels of charge corresponding to varying data states on the fourth body region.

13. A semiconductor memory structure, comprising:

a semiconductor substrate;

a first body region having a lower surface disposed over an upper surface of the semiconductor substrate;

a first write wordline extending upwardly and substantially perpendicularly from the upper surface of the semiconductor substrate, past the lower surface and along a first side of the first body region, the first write wordline being separated from the first side of the first body region by a first write wordline gate dielectric;

a first read bitline extending upwardly and substantially perpendicularly from the upper surface of the semiconductor substrate and parallel to the first write wordline and coupled to a second side of the first body region opposite the first side;

a first write bitline extending substantially perpendicular to the first write wordline beneath a lower surface of the first body region and disposed between the first write wordline and the first read bitline;

a first read wordline extending parallel to the first write bitline, the first read wordline being separated from the lower surface of the first body region by a first read wordline gate dielectric; and a first capacitive element disposed over an upper surface of the first body region and disposed between the first write wordline and the first read bitline, the first capacitive element configured to selectively store varying levels of charge corresponding to varying data states on the first body region.

14. The semiconductor memory structure of claim 13, wherein the first write wordline extends along a first side of the first body region, the first read bitline extends on a second side of the first body region opposite the first side, and the first read wordline extends along the lower surface of the first body region between the first read bitline and the first write wordline.

15. The semiconductor memory structure of claim 13, further comprising:

a second body region disposed over an upper surface of the first capacitive element and coupled to the first read bitline; and a third body region coupled to the first read bitline opposite the first body region, wherein the first read bitline is coupled to a first side of the third body region and separates the first body region and the third body region.

16. The semiconductor memory structure of claim 15, further comprising a second write wordline lining a second side of the third body region opposite the first side, wherein the first side of the third body region is closer to the second write wordline than the first write wordline.

17. The semiconductor memory structure of claim 13, wherein the first write bitline contacts the first read wordline gate dielectric and is coupled to the first body region.

18. The semiconductor memory structure of claim 13, further comprising:
- a drain extending over the upper surface of the first body region, extending between the first body region and the first capacitive element; and
- a capacitor dielectric disposed between the first capacitive element and the first body region, the capacitor dielectric spacing the drain from the first read bitline.

19. The semiconductor memory structure of claim 13, further comprising:
- a first dielectric region spacing the first write bitline from the first write wordline gate dielectric; and
- a second dielectric region confined directly beneath the first read wordline gate dielectric and spacing the first write bitline from the first read wordline.

20. The semiconductor memory structure of claim 13 wherein the first read wordline is disposed between the first write bitline and the first read bitline.

\* \* \* \* \*